United States Patent
Kim et al.

(10) Patent No.: US 9,525,145 B2
(45) Date of Patent: Dec. 20, 2016

(54) SILICON-BASED COMPOUND AND ORGANIC LIGHT EMITTING DIODE COMPRISING THE SAME

(71) Applicants: SAMSUNG DISPLAY CO., LTD., Yongin, Gyeonggi-Do (KR); INDUSTRY-ACADEMIC COOPERATION FOUNDATION GYEONGSANG NATIONAL UNIVERSITY, Jinju, Gyeongnam (KR)

(72) Inventors: Mi-Kyung Kim, Yongin (KR); Chang-Woong Chu, Yongin (KR); Jae-Young Hwang, Jinju (KR); Yun-Hi Kim, Jinju (KR); Soon-Ki Kwon, Jinju (KR)

(73) Assignees: Samsung Display Co., Ltd., Yongin-si (KR); Industry-Academic Cooperation Foundation Gyeongsang National University, Gyeongnam (KR)

( * ) Notice: Subject to any disclaimer, the term of this patent is extended or adjusted under 35 U.S.C. 154(b) by 637 days.

(21) Appl. No.: 13/949,170

(22) Filed: Jul. 23, 2013

(65) Prior Publication Data
US 2014/0191207 A1    Jul. 10, 2014

(30) Foreign Application Priority Data
Jan. 4, 2013  (KR) .................. 10-2013-0001313

(51) Int. Cl.
*H01L 51/00* (2006.01)
*H01L 51/50* (2006.01)
*C09K 11/06* (2006.01)

(52) U.S. Cl.
CPC ........... *H01L 51/0094* (2013.01); *C09K 11/06* (2013.01); *H01L 51/0072* (2013.01); *C09K 2211/1007* (2013.01); *C09K 2211/1029* (2013.01); *H01L 51/5012* (2013.01); *H01L 51/5016* (2013.01)

(58) Field of Classification Search
CPC ............ C09K 11/06; C09K 2211/1007; C09K 2211/1029; H01L 51/0072; H01L 51/0094; H01L 51/5012; H01L 51/5016
See application file for complete search history.

(56) References Cited

U.S. PATENT DOCUMENTS

| | | | |
|---|---|---|---|
| 6,310,231 B1 | 10/2001 | Igarashi et al. | |
| 7,413,817 B2 | 8/2008 | Lee et al. | |
| 2012/0153272 A1* | 6/2012 | Fukuzaki | C07D 487/04 257/40 |
| 2013/0168646 A1* | 7/2013 | Kim | H01L 51/0059 257/40 |
| 2014/0209869 A1* | 7/2014 | Jung | H01L 51/006 257/40 |

FOREIGN PATENT DOCUMENTS

| | | |
|---|---|---|
| JP | 2000-351966 A | 12/2000 |
| JP | 2004-200103 A | 7/2004 |

(Continued)

OTHER PUBLICATIONS

Hu et al., Tetrahedron, vol. 66, (2010), pp. 7583-7589.*

*Primary Examiner* — Dawn Garrett
(74) *Attorney, Agent, or Firm* — Lewis Roca Rothgerber Christie LLP

(57) ABSTRACT

A silicon based compound and an organic light-emitting diode including the same.

20 Claims, 5 Drawing Sheets

(56) References Cited

FOREIGN PATENT DOCUMENTS

| | | | |
|---|---|---|---|
| JP | 2004-200104 A | | 7/2004 |
| JP | 2005-220088 A | | 8/2005 |
| KR | 10-2005-0029769 A | | 3/2005 |
| KR | 10-2007-0059689 A | | 6/2007 |
| KR | 20100027760 A | * | 3/2010 |

* cited by examiner

SILICON-BASED COMPOUND AND ORGANIC LIGHT EMITTING DIODE COMPRISING THE SAME

CROSS-REFERENCE TO RELATED PATENT APPLICATION

This application claims priority to and the benefit of Korean Patent Application No. 10-2013-0001313, filed on Jan. 4, 2013, in the Korean Intellectual Property Office, the entire content of which is incorporated herein by reference.

BACKGROUND

1. Field

The following description relates to a compound for an organic light-emitting diode and an organic light-emitting diode.

2. Description of the Related Art

Organic light-emitting diodes (OLEDs), which are self-emitting diodes, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. The hole transport layer, the emission layer, and the electron transport layer are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the emission layer via the electron transport layer. The holes and electrons (carriers) recombine in the organic emission layer to generate excitons. When the excitons drop from an excited state to a ground state, light is emitted.

SUMMARY

Aspects of the present invention are directed toward a silicon-based compound having a novel structure and an organic light-emitting diode including the same.

According to an embodiment of the present invention, there is provided a silicon-based compound represented by Formula 1:

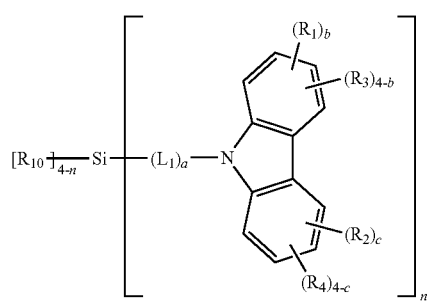

Formula 1

In Formula 1, $L_1$ is a substituted or unsubstituted $C_6$-$C_{60}$ arylene group or a substituted or unsubstituted $C_2$-$C_{60}$ heteroarylene group;

a is an integer of 1 to 5, when a is 2 or more, a plurality of $L_1$ may be identical to or different from each other;

$R_1$ and $R_2$ are, each independently, a $C_1$-$C_{60}$ alkyl group substituted with at least one —F;

b and c are, each independently, an integer of 0 to 4, and $b+c \geq 1$;

$R_3$ and $R_4$ are each independently selected from, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$R_{10}$ is selected from, a $C_1$-$C_{60}$ alkyl group, a $C_2$-$C_{60}$ alkenyl group, and a $C_2$-$C_{60}$ alkynyl group;

a $C_1$-$C_{60}$ alkyl group, a $C_2$-$C_{60}$ alkenyl group, and a $C_2$-$C_{60}$ alkynyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) (wherein $Q_{11}$ and $Q_{12}$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group); and n is selected from an integer of 2 to 4.

According to another embodiment of the present invention, there is provided an organic light-emitting diode including a first electrode; a second electrode facing the first electrode; and an organic layer interposed between the first electrode and the second electrode and comprising an emission layer, wherein the organic layer includes at least one of the silicon-based compound.

BRIEF DESCRIPTION OF THE DRAWINGS

The above and other features and advantages of the present invention will become more apparent by describing in detail exemplary embodiments thereof with reference to the following Figures.

DETAILED DESCRIPTION

Figure 1:
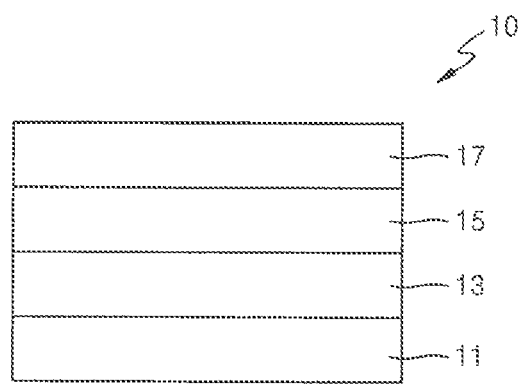
FIG. 1 is a schematic view of an organic light-emitting diode according to an embodiment of the present invention.

Expressions such as "at least one of," when preceding a list of elements, modify the entire list of elements and do not modify the individual elements of the list.

The silicon-based compound is represented by Formula 1 below:

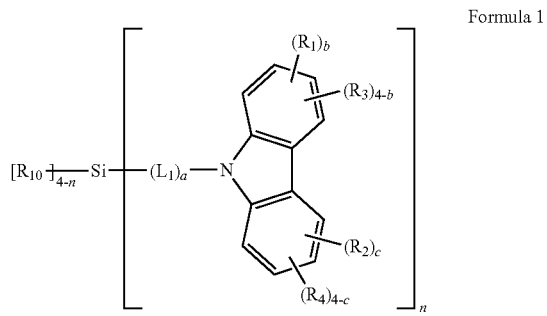

Formula 1

In Formula 1, $L_1$ is a substituted or unsubstituted $C_6$-$C_{60}$ arylene group or a substituted or unsubstituted $C_2$-$C_{60}$ heteroarylene group.

For example, $L_1$ in Formula 1 may be selected from, i) phenylene, pentalenylene, indenylene, naphtylene, azulenylene, heptalenylene, indacenylene, acenaphtylene, fluorenylene, spiro-fluorenylene, phenalenylene, phenanthrenylene, anthrylene, fluoranthenylene, triphenylenylene, pyrenylene, chrysenylene, naphthacenylene, picenylene, perylenylene, pentaphenylene, hexacenylene, pyrrolylene, imidazolylene, pyrazolylene, pyridinylene, pyrazinylene, pyrimidinylene, pyridazinylene, isoindolylene, indolylene, indazolylene, purinylene, quinolinylene, benzoquinolinylene, phthalazinylene, naphthyridinylene, quinoxalinylene, quinazolinylene, cinnolinylene, carbazolylene, phenanthridinylene, acridinylene, phenanthrolinylene, phenazinylene, benzooxazolylene, benzoimidazolylene, furanylene, benzofuranylene, thiophenylene, benzothiophenylene, thiazolylene, isothiazolylene, benzothiazolylene, isoxazolylene, oxazolylene, triazolylene, tetrazolylene, oxadiazolylene, triazinylene, benzoxazolylene, dibenzofuranylene, dibenzothiophenylene, and benzocarbazolylene; and ii) phenylene, pentalenylene, indenylene, naphtylene, azulenylene, heptalenylene, indacenylene, acenaphtylene, fluorenylene, spiro-fluorenylene, phenalenylene, phenanthrenylene, anthrylene, fluoranthenylene, triphenylenylene, pyrenylene, chrysenylene, naphthacenylene, picenylene, perylenylene, pentaphenylene, hexacenylene, pyrrolylene, imidazolylene, pyrazolylene, pyridinylene, pyrazinylene, pyrimidinylene, pyridazinylene, isoindolylene, indolylene, indazolylene, purinylene, quinolinylene, benzoquinolinylene, phthalazinylene, naphthyridinylene, quinoxalinylene, quinazolinylene, cinnolinylene, carbazolylene, phenanthridinylene, acridinylene, phenanthrolinylene, phenazinylene, benzooxazolylene, benzoimidazolylene, furanylene, benzofuranylene, thiophenylene, benzothiophenylene, thiazolylene, isothiazolylene, benzothiazolylene, isoxazolylene, oxazolylene, triazolylene, tetrazolylene, oxadiazolylene, triazinylene, benzoxazolylene, dibenzofuranylene, dibenzothiophenylene, and benzocarbazolylene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, triazinyl group, quinolyl, and isoquinolyl.

For example, $L_1$ in Formula 1 may be selected from Formulae 2-1 to 2-8, but is not limited thereto:

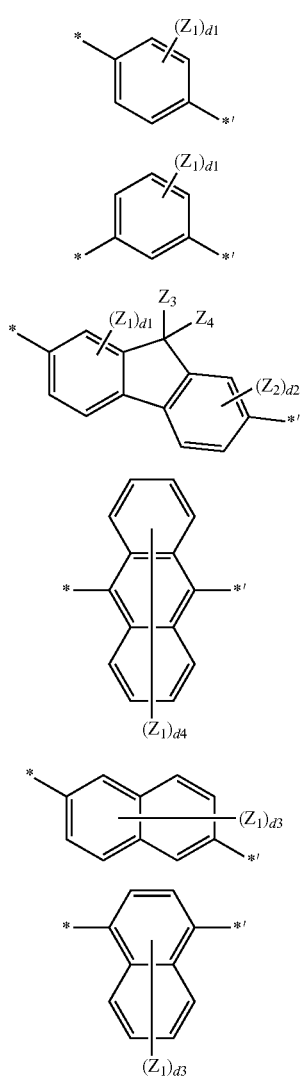

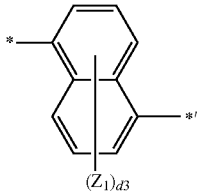

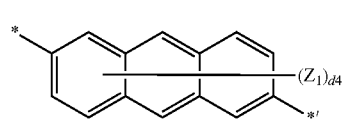

$Z_1$ to $Z_4$ in Formulae 2-1 to 2-8 are, each independently, selected from, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof; and phenyl group, naphthyl, and anthryl;

d1 is an integer of 1 to 4; d2 is an integer of 1 to 3; d3 is an integer of 1 to 6; d4 is an integer of 1 to 8; * is a binding site with Si of Formula 1 or is a binding site with a neighboring $L_1$; and *' is a binding site with "N" of carbazol of Formula 1 or a binding site of a neighboring $L_1$.

According to an embodiment of the present invention, $L_1$ in Formula 1 may be represented by Formula 2-1 or 2-2, but is not limited thereto.

a in Formula 1 refers to the number of $L_1$, may be an integer of 1 to 5. When a is 2 or more, a plurality of $L_1$ may be identical to or different from one another. For example, a may be 1 or 2. According to an embodiment of the present invention, a may be 1, but is not limited thereto.

$R_1$ and $R_2$ in Formula 1 are, each independently, a $C_1$-$C_{60}$ alkyl group substituted with at least one —F. The $C_1$-$C_{60}$ alkyl group substituted with at least one —F may be a linear or branched group.

For example, $R_1$ and $R_2$ in Formula 1 are, each independently, a $C_1$-$C_{60}$ perfluoro alkyl group, in detail, a $C_1$-$C_{20}$ perfluoro alkyl group.

According to another embodiment of the present invention, $R_1$ and $R_2$ in Formula 1 are, each independently, selected from methyl, ethyl, propyl, butyl, pentyl, hexyl, heptyl, and octyl, each substituted with at least one —F.

According to another embodiment of the present invention, $R_1$ and $R_2$ in Formula 1 may be, each independently, selected from methyl, ethyl, propyl, butyl, pentyl, hexyl, heptyl, and octyl, in which all hydrogen atoms are substituted with —F.

According to another embodiment of the present invention, $R_1$ and $R_2$ may be, each independently, selected from —$CF_3$, —$C_2F_5$, —$C_3F_7$, —$C_4F_9$, —$C_5F_{11}$, and —$C_6F_{13}$.

According to another embodiment of the present invention, $R_1$ and $R_2$ may be identical to each other.

In Formula 1, b refers to the number of $R_1$, and c refers to the number of $R_2$. b and c are each independently an integer of 0 to 4, and b+c≥1. That is, b and c are not both 0. Accordingly, at least one of $R_1$ and $R_2$ exists in Formula 1.

When b is 2 or more, a plurality of $R_1$ may be identical to or different from each other, and when c is 2 or more, a plurality of $R_2$ may be identical to or different from each other.

According to an embodiment of the present invention, b and c in Formula 1 may be, each independently, 0, 1, or 2, and b+c≥1.

$R_3$ and $R_4$ in Formula 1 are, each independently, selected from, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

According to an embodiment of the present invention, $R_3$ and $R_4$ are, each independently, selected from, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{10}$ alkyl group, and a $C_1$-$C_{10}$ alkoxy group;

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

phenyl, naphthyl, anthryl, fluorenyl, phenanthrenyl, pyrenyl, and chrysenyl; and phenyl, naphthyl, anthryl, fluorenyl, phenanthrenyl, pyrenyl, and chrysenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group, but is not limited thereto.

According to another embodiment of the present invention, $R_3$ and $R_4$ in Formula 1 are, each independently, selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{10}$ alkyl group, a $C_1$-$C_{10}$ alkoxy group, phenyl, naphthyl, and anthryl.

According to another embodiment of the present invention, $R_3$ and $R_4$ in Formula 1 may all be a hydrogen atom.

$R_{10}$ in Formula 1 may be selected from, a $C_1$-$C_{60}$ alkyl group, a $C_2$-$C_{60}$ alkenyl group, and a $C_2$-$C_{60}$ alkynyl group;

a $C_1$-$C_{60}$ alkyl group, a $C_2$-$C_{60}$ alkenyl group, and a $C_2$-$C_{60}$ alkynyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) (wherein $Q_{11}$ and $Q_{12}$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group).

According to an embodiment of the present invention, $R_{10}$ in Formula 1 may be selected from, a $C_1$-$C_{10}$ alkyl group;

a $C_1$-$C_{10}$ alkyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

phenyl, naphthyl, anthryl, fluorenyl, phenanthrenyl, pyrenyl, and chrysenyl; and phenyl, naphthyl, anthryl, fluorenyl, phenanthrenyl, pyrenyl, and chrysenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

n in Formula 1 may be an integer of 2 to 4.

According to an embodiment of the present invention, n may be 2, but is not limited thereto.

The silicon-based compound may be represented by one of Formulae 1A to 1F below, but is not limited thereto:

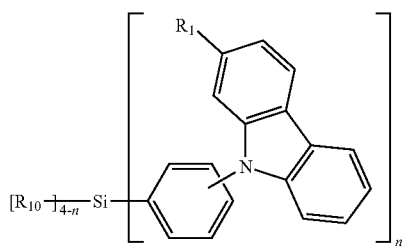

Formula 1A

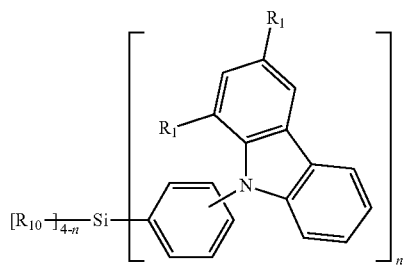

Formula 1B

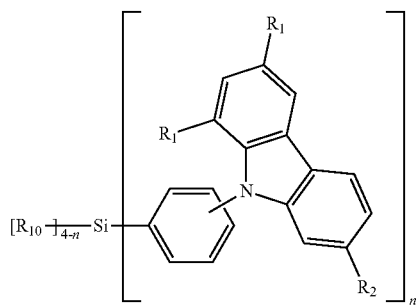

Formula 1C

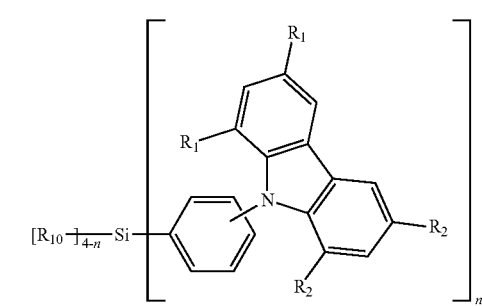

Formula 1D

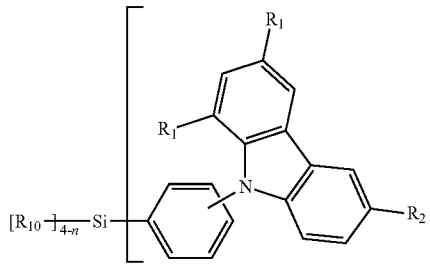

Formula 1E

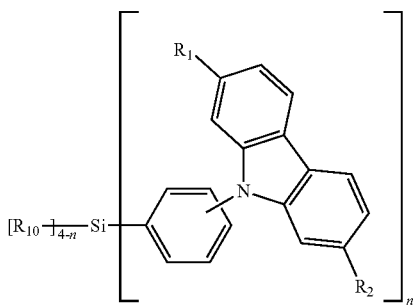

Formula 1F $R_1$, $R_2$, $R_{10}$ and n in Formulae 1A to 1F are the same as described in the present specification.

For example, in Formulae 1A to 1F, $R_1$ and $R_2$ are, each independently, selected from methyl, ethyl, propyl, butyl, pentyl, hexyl, heptyl, and octyl, each substituted with at least one —F;

$R_{10}$ is selected from, a $C_1$-$C_{10}$ alkyl group;

a $C_1$-$C_{10}$ alkyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

phenyl, naphthyl, anthryl, fluorenyl, phenanthrenyl, pyrenyl and chrysenyl; and phenyl, naphthyl, anthryl, fluorenyl, phenanthrenyl, pyrenyl, and chrysenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and n is an integer of 2 to 4.

According to another embodiment of the present invention, in Formulae 1A to 1F, $R_1$ and $R_2$ are, each independently, selected from —$CF_3$, —$C_2F_5$, —$C_3F_7$, —$C_4F_9$, —$C_5F_{11}$, and —$C_6F_{13}$; $R_{10}$ is selected from a $C_1$-$C_{10}$ alkyl group, phenyl, naphthyl, and anthryl; and n may be 2, but is not limited thereto.

According to another embodiment of the present invention, the silicon-based compound represented by Formula 1 has a highest occupied molecular orbit (HOMO) energy level absolute value of 5.80 eV or more, and has a lowest unoccupied molecular orbit (LUMO) energy level absolute value of 2.20 eV or more. Compounds with such HOMO and LUMO energy level absolute values and an energy band gap (Eg) calculated therefrom are suitable for use as a material for an organic light-emitting diode, for example, a host of an emission layer. This is confirmed in Evaluation Examples.

In detail, the silicon-based compound may be one of Compounds 1 to 10, but is not limited thereto:

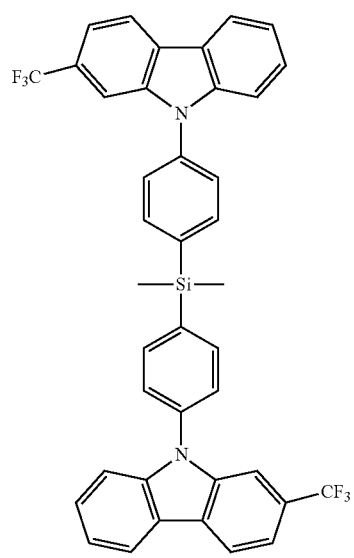

1

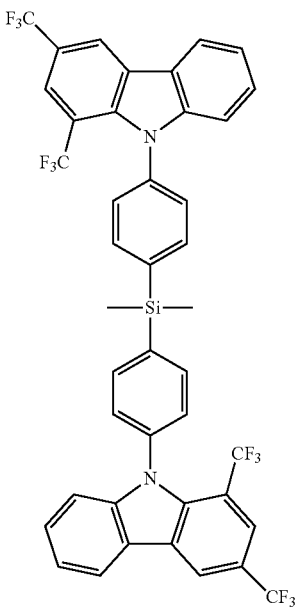

3

-continued

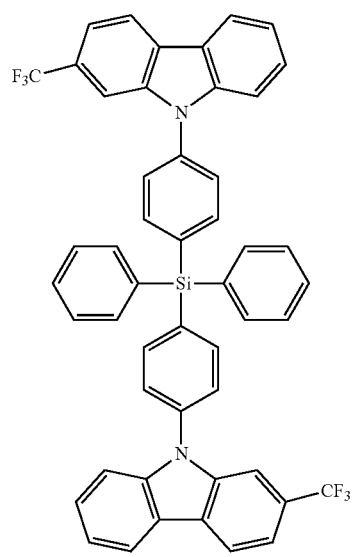

2

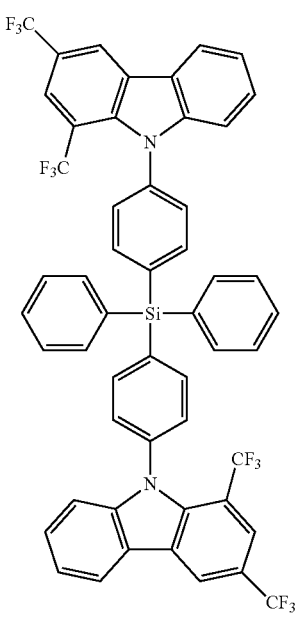

4

5
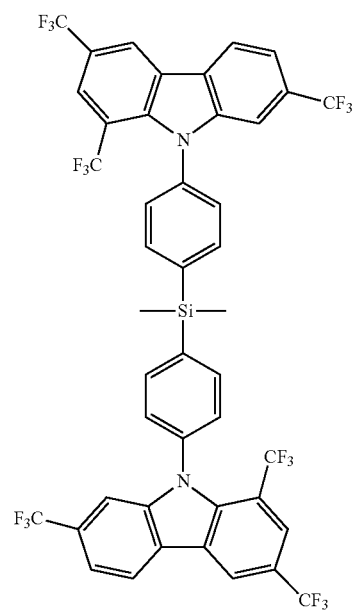
6
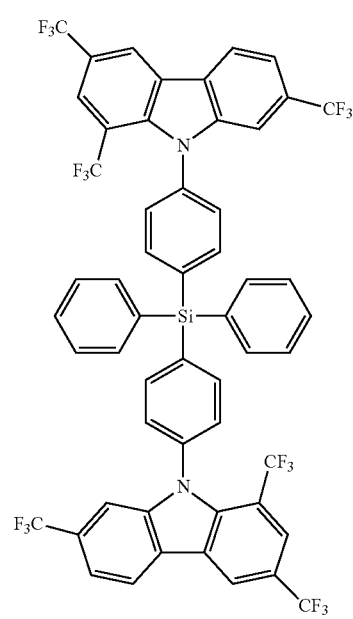
7
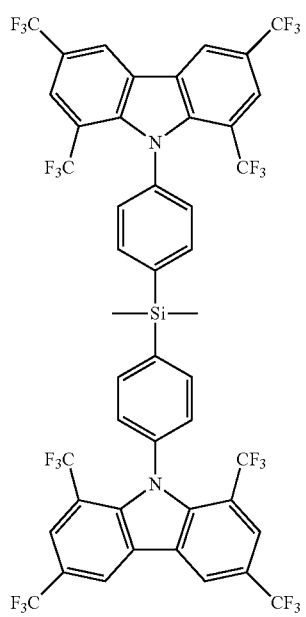
8
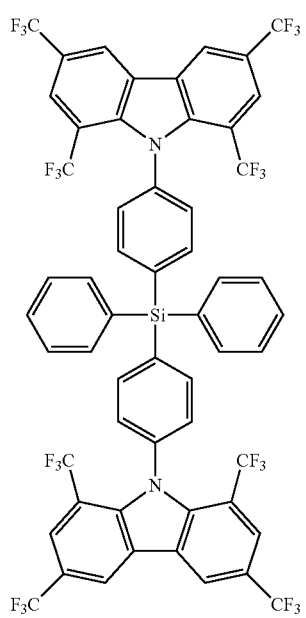
9
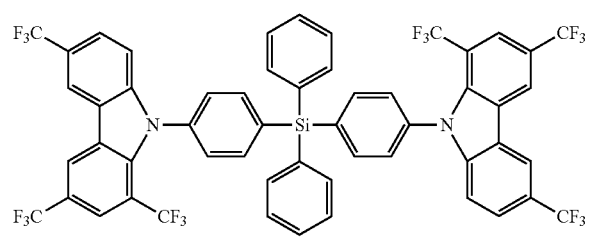

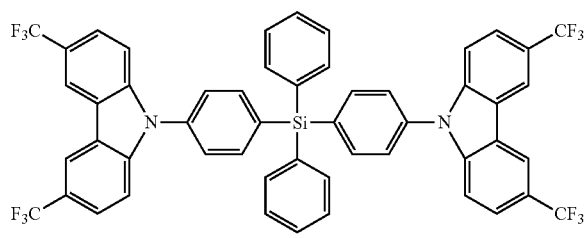

$R_1$ and $R_2$ in the silicon-based compound of Formula 1 are each independently selected from a $C_1$-$C_{60}$ alkyl group substituted with at least one —F. The number of $R_1$ is indicated by b, and the number of $R_2$ is indicated by c, and b and c are each an integer of 0 to 4, and b+c≥1. That is, b and c are not both 0. Accordingly, since at least one of $R_1$ and $R_2$ of the silicon-based compound of Formula 1 is necessarily substituted with a carbazol group, at least one of hydrogen atom of the carbazol group of the silicon-based compound of Formula 1 is necessarily substituted with a $C_1$-$C_{60}$ alkyl group substituted with at least one —F.

When $R_1$ and $R_2$ are, each independently, a $C_1$-$C_{60}$ alkyl group substituted with at least one —F (for example, —$CF_3$), the silicon-based compound represented by Formula 1 may have excellent thermal stability. Accordingly, an organic light-emitting diode including the silicon-based compound represented by Formula 1 may have excellent efficiency characteristics.

For example, an imaginary compound which is the same as the silicon-based compound represented by Formula 1 except that $R_1$ and $R_2$ are each —F (see, for example, Compound C of Comparative Example 3), may have low synthesis efficiency and low thermal stability due to the inclusion of —F, which has very high reactivity.

In addition, since $R_1$ and $R_2$ in the silicon-based compound represented by Formula 1 are substituted with a carbazol group, an LUMO energy level absolute value of the silicon-based compound represented by Formula 1 may be high. Accordingly, the silicon-based compound represented by Formula 1 may be useful as a material for an organic light-emitting diode, for example, a blue phosphorescent host which is used together with a blue phosphorescent dopant.

For example, an imaginary compound which is the same as the silicon-based compound represented by Formula 1, except that such $R_1$ and $R_2$ are not included and at least one of hydrogen atom of $L_1$ is substituted with a $C_1$-$C_{60}$ alkyl group substituted with at least one —F (for example, Compound B of Comparative Example 2), may have a relatively low LUMO energy level absolute value due to the absence of $R_1$ and $R_2$. Accordingly, since the imaginary compound has a relatively small energy band gap (Eg) (a difference between a HOMO energy level absolute value and a LUMO energy level absolute value), the imaginary compound may be inappropriate for use as a material for an organic light-emitting diode, for example, a blue phosphorescent host which is used together with a blue phosphorescent dopant.

Accordingly, an organic light-emitting diode including the silicon-based compound represented by Formula 1 may have a low driving voltage, high efficiency, high brightness, and long lifetime.

The silicon-based compound of Formula 1 may be synthesized by using a known organic synthesis method. A synthesis method for the condensed cyclic compound may be apparent to one of ordinary skill in the art by referring to the following Examples.

The silicon-based compound of Formula 1 may be used between a pair of electrodes of an organic light-emitting diode. For example, the silicon-based compound may be used in an emission layer.

Accordingly, provided is an organic light-emitting diode including a first electrode, a second electrode facing the first electrode, and an organic layer that is interposed between the first electrode and the second electrode and includes an emission layer, wherein the organic layer includes the silicon-based compound represented by Formula 1.

The wording that "(an organic layer) includes at least one of silicon-based compound" used herein may be interpreted as the meaning that "(an organic layer) includes at least one of silicon-based compound represented by Formula 1 or at least two different silicon-based compounds each represented by Formula 1."

For example, the organic layer may include only Compound 1 as the silicon-based compound. In this regard, Compound 1 may exist in an emission layer of an organic light-emitting diode. Alternatively, the organic layer may include, as the silicon-based compound, Compound 1 and Compound 2. In this regard, Compound 1 and Compound 2 may exist in an identical layer (for example, Compound 1 and Compound 2 may both exist in an emission layer).

The organic layer may further include i) at least one layer selected from a hole injection layer, a hole transport layer, a functional layer having a hole injection function and a hole transport function, a buffer layer, and an electron blocking layer between the first electrode and the emission layer, and ii) at least one layer selected from a hole blocking layer, an electron transport layer, and an electron injection layer interposed between the emission layer and the second electrode.

The "organic layer" term used herein refers to a single layer and/or a multi-layer interposed between the first electrode and the second electrode of the organic light-emitting diode.

The organic layer may include an emission layer, and the emission layer may include the silicon-based compound. In this regard, the silicon-based compound of the emission layer may function as a host, and the emission layer may further include a phosphorescent dopant or a fluorescent dopant.

According to an embodiment of the present invention, the silicon-based compound may exist in the emission layer, and the emission layer may further include a blue phosphorescent dopant that emits blue light based on a phosphorescent emission mechanism, and the silicon-based compound in the emission layer may function as a host.

FIG. 1 is a schematic sectional view of an organic light-emitting diode 10 according to an embodiment of the present invention. Hereinafter, the structure and manufacturing method of an organic light-emitting diode according to an embodiment of the present invention is described in detail with reference to FIG. 1.

A substrate 11 (which may be any substrate that is used in general organic light-emitting diodes) may be a glass substrate or a transparent plastic substrate with excellent mechanical strength, thermal stability, transparency, surface smoothness, ease of handling, and water resistance.

A first electrode 13 may be formed by, for example, depositing or sputtering a material for a first electrode on the substrate 11. When the first electrode 13 is an anode, the material for the first electrode may be selected from materials with a high work function to enable ease of hole injection. The first electrode 13 may be a reflective electrode or a transmissive electrode. The material for the first electrode may be a transparent material with high conductivity, and examples of such a material are indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), or magnesium-silver (Mg—Ag) is used, the first electrode 13 may be used as a reflective electrode.

The first electrode 13 may have a single-layer structure or a multi-layer structure including at least two layers. For example, the first electrode 13 may have a three-layered structure of ITO/Ag/ITO, but is not limited thereto.

The organic layer 15 may be disposed on the first electrode 13.

The organic layer 15 may include a hole injection layer, a hole transport layer, a buffer layer, an emission layer, an electron transport layer, and an electron injection layer.

A hole injection layer (HIL) may be formed on the first electrode 13 by using various methods, such as vacuum deposition, spin coating, casting, and Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the spin coating rate may be in the range of about 2000 rpm to about 5000 rpm, and a temperature at which heat treatment is performed to remove a solvent after coating may be in the range of about 80° C. to about 200° C. However, the coating conditions are not limited thereto.

As a material for the HIL, a known hole injection material may be used. Examples thereof are N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrene sulfonate) (PEDOT/PSS), polyaniline/camphor sulfonic acid (Pani/CSA), and (polyaniline)/poly(4-styrene sulfonate) (PANI/PSS), but are not limited thereto:

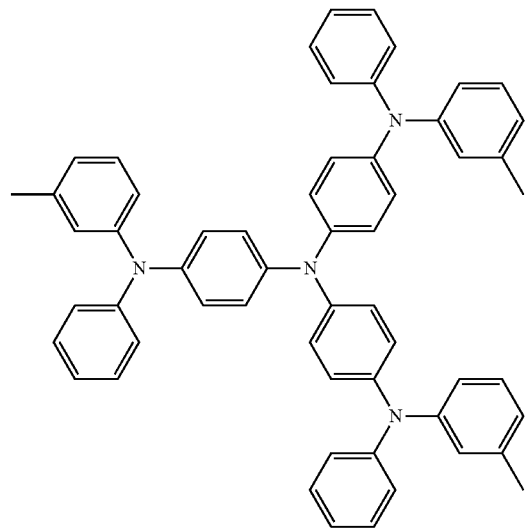

m-MTDATA

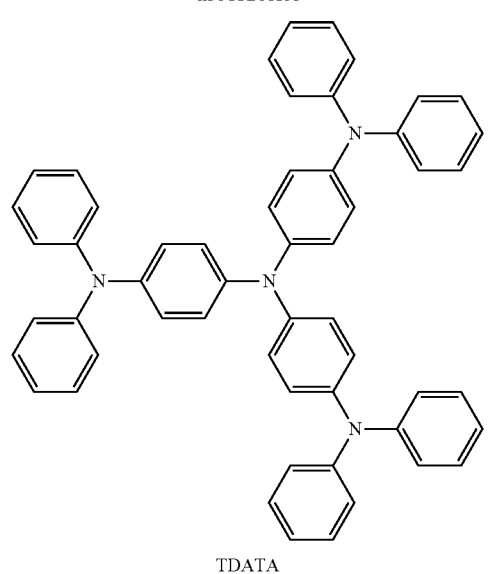

TDATA

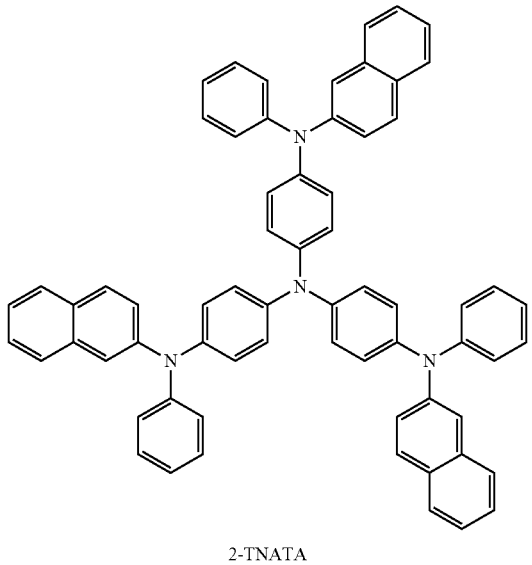

2-TNATA

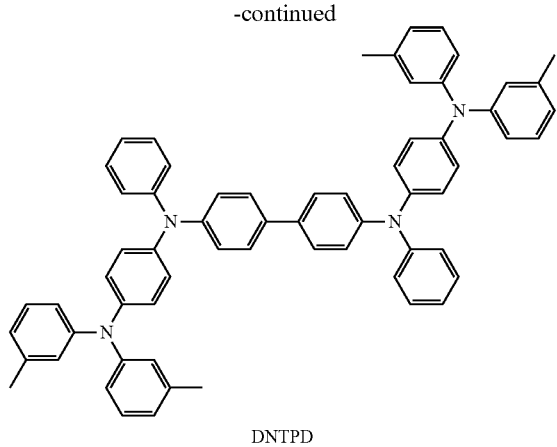

DNTPD

A thickness of the HIL may be in a range of about 100 Å to about 10000 Å, for example, about 100 Å to about 1000 Å. When the thickness of the HIL is within the range described above, the HIL may have satisfactory hole injection characteristics without a substantial increase in a driving voltage.

Then, a hole transport layer (HTL) may be formed on the HIL by using vacuum deposition, spin coating, casting, LB deposition, or other suitable methods. When the HTL is formed using vacuum deposition or spin coating, the deposition and coating conditions may be similar to those for the formation of the HIL, though the deposition and coating conditions may vary according to a compound that is used to form the HTL.

As a material for the HTL, a known material for a HTL may be used. Examples thereof are a carbazole derivative, such as N-phenylcarbazole, or polyvinylcarbazole, N,N'-bis (3-methylphenyl)-N,N'-diphenyl-[1,1-biphenyl]-4,4'-diamine (TPD), 4,4',4"-tris(N-carbazolyl)triphenylamine (TCTA), or N,N'-di(1-naphthyl)-N,N'-diphenylbenzidine (NPB), but are not limited thereto.

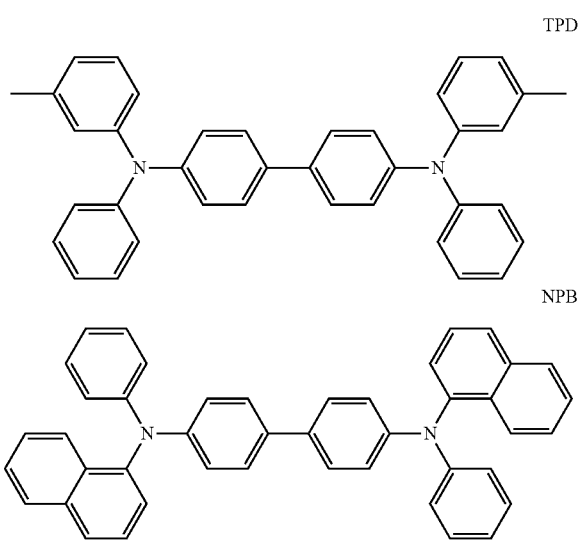

TPD

NPB

A thickness of the HTL may be in a range of about 50 Å to about 2000 Å, for example, about 100 Å to about 1500 Å. When the thickness of the HTL is within the range described above, the HTL may have satisfactory hole transport characteristics without a substantial increase in a driving voltage.

The H-functional layer (a functional layer with a hole injection function and a hole transport function) may include at least one material selected from those materials for the HIL and those materials for the HTL, and the H-functional layer may have a thickness of about 100 Å to about 10000 Å, for example, about 100 Å to about 1000 Å. When the thickness of the H-functional layer is within the range described above, satisfactory hole injection and transportation characteristics may be obtained without a substantial increase in a driving voltage.

Also, at least one of the hole injection layer, the hole transport layer, and the H-functional layer may include at least one of a compound represented by Formula 300 below and a compound represented by Formula 301 below:

Formula 300

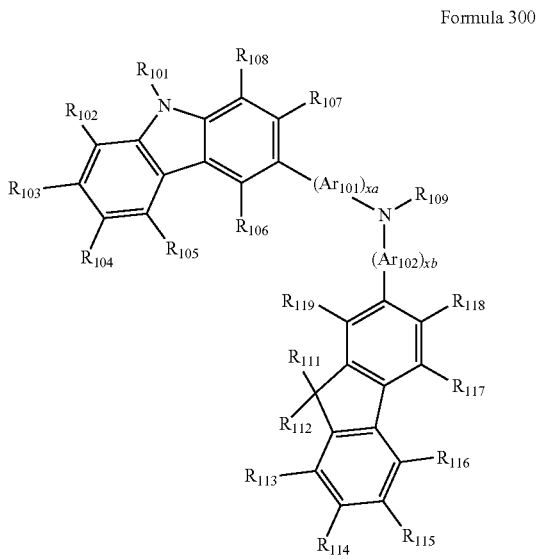

Formula 301

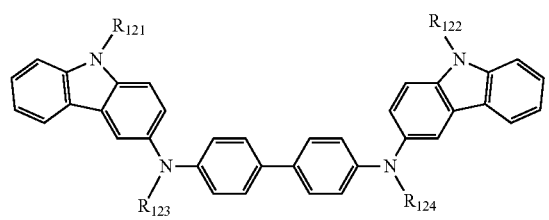

$Ar_{101}$ and $Ar_{102}$ in Formula 300 are, each independently, a substituted or unsubstituted $C_6$-$C_{60}$ arylene group. For example, $Ar_{101}$ and $Ar_{102}$ are, each independently, selected from, phenylene, pentalenylene, indenylene, naphtylene, azulenylene, heptalenylene, substituted or unsubstituted acenaphtylene, fluorenylene, phenalenylene, phenanthrenylene, anthrylene, fluoranthenylene, triphenylenylene, pyrenylene, chrysenylene, naphthacenylene, picenylene, perylenylene, and pentaphenylene; and phenylene, pentalenylene, indenylene, naphtylene, azulenylene, heptalenylene, substituted or unsubstituted acenaphtylene, fluorenylene, phenalenylene, phenanthrenylene, anthrylene, fluoranthenylene, triphenylenylene, pyrenylene, chrysenylene, naphthacenylene, picenylene, perylenylene, and pentaphenylene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

xa and xb in Formula 300 may each independently an integer of 0 to 5, or 0, 1 or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 300 and 301 are, each independently, selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthyo group. For example, $R_{51}$ to $R_{56}$, $R_{61}$ to $R_{69}$ and $R_{71}$ and $R_{72}$ are each independently selected from, a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group (for example, methyl, ethyl, propyl, butyl, pentyl, or hexyl) and a $C_1$-$C_{10}$ alkoxy group (for example, a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof;

phenyl, naphthyl, anthryl, fluorenyl and pyrenyl; and phenyl, naphthyl, anthryl, fluorenyl, and pyrenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{10}$ alkyl group, and a $C_1$-$C_{10}$ alkoxy group, but is not limited thereto.

$R_{109}$ in Formula 300 may be selected from, phenyl, naphthyl, anthryl, biphenyl and pyridyl; and phenyl group, naphthyl, anthryl, biphenyl, and pyridyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof, a substituted or unsubstituted $C_1$-$C_{20}$ alkyl group, and a substituted or unsubstituted $C_1$-$C_{20}$ alkoxy group.

According to an embodiment of the present invention, the compound represented by Formula 300 may be represented by Formula 300A below, but is not limited thereto:

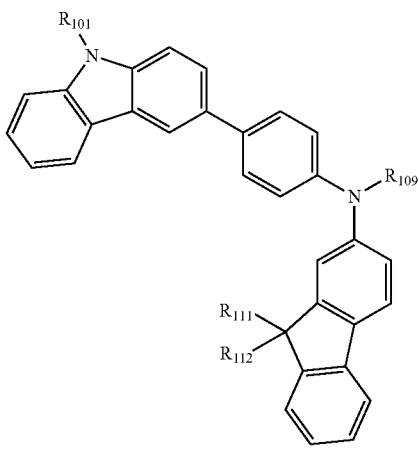

Formula 300A $R_{101}$, $R_{111}$, $R_{112}$ and $R_{109}$ in Formula 300A is already described above.

For example, at least one layer selected from the hole injection layer, the hole transport layer, and the H-functional layer may include at least one of Compounds 301 to 320 below, but may instead include other materials:

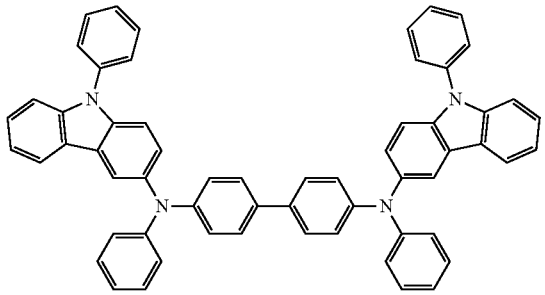

301

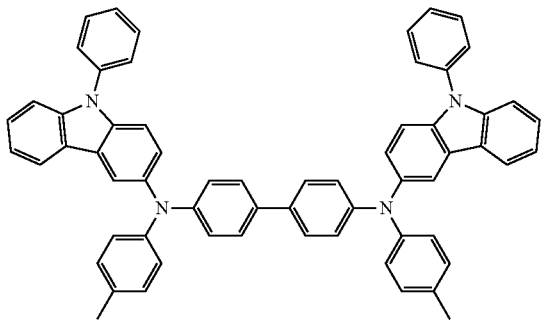

302

303
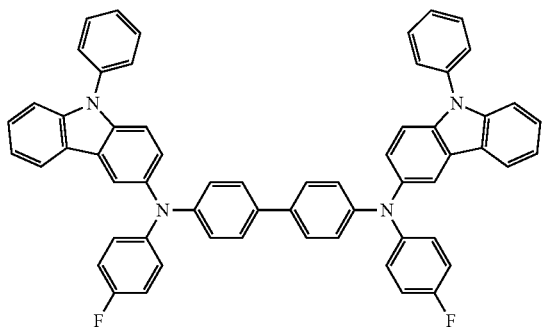
304
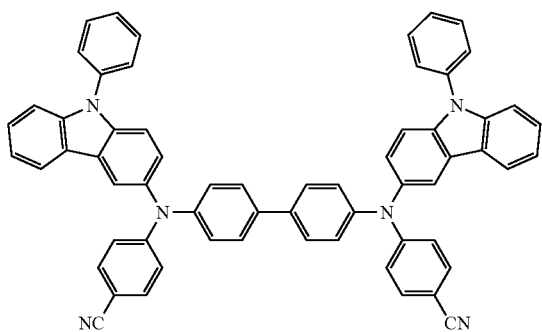
305
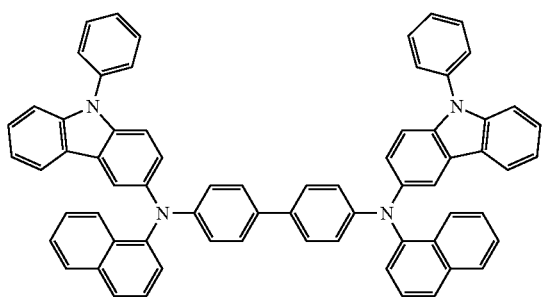
306
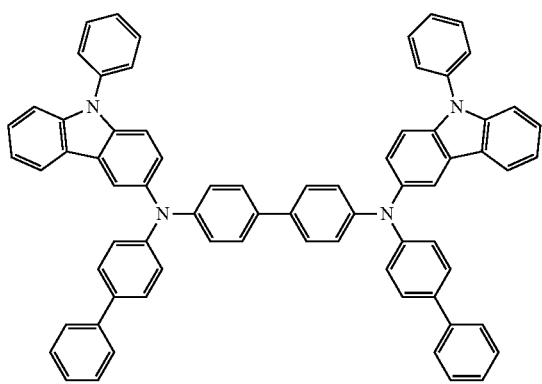
307
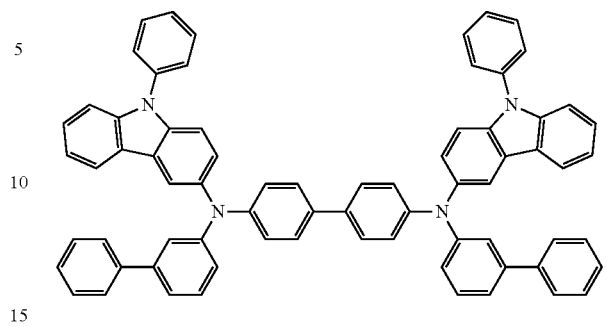
308
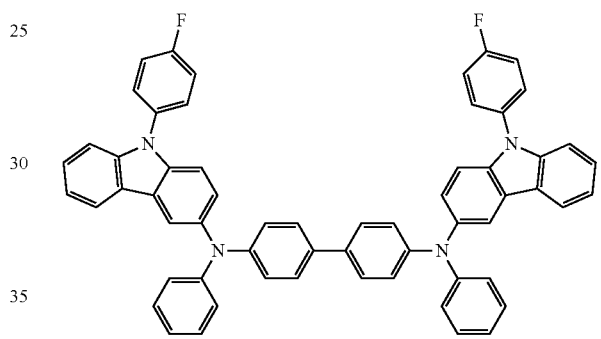
309
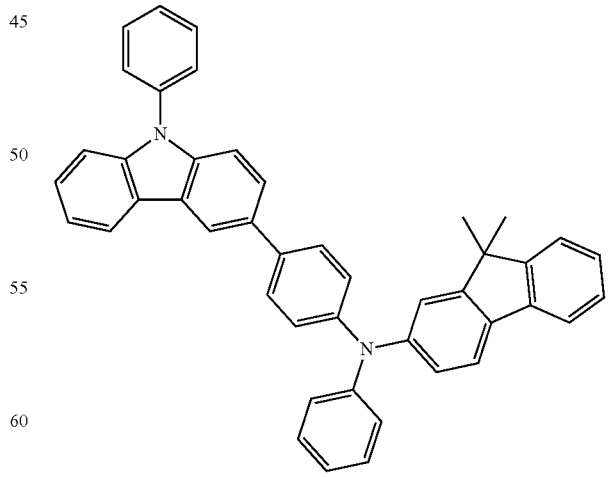

310
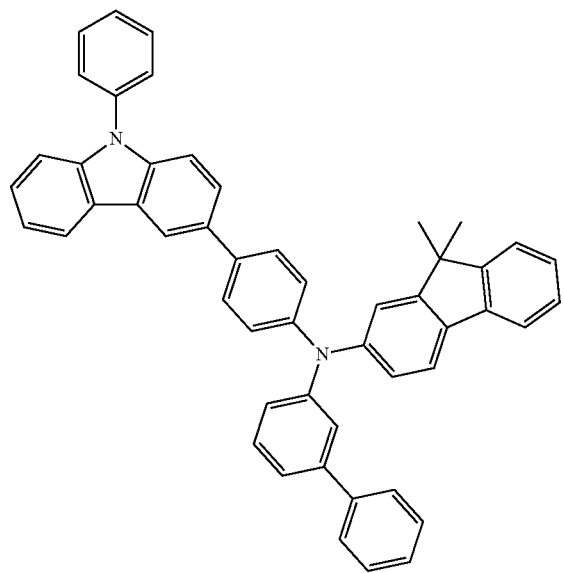
311
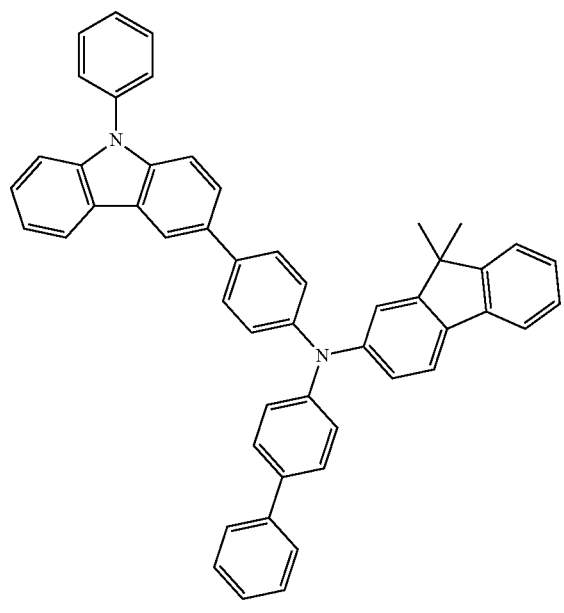
312
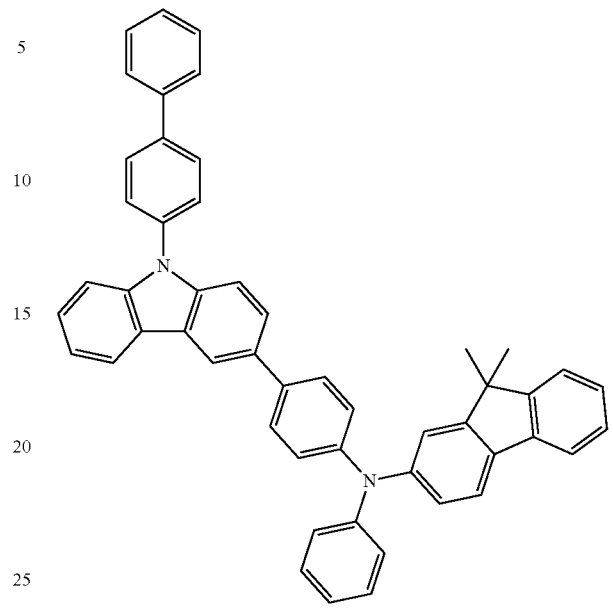
313
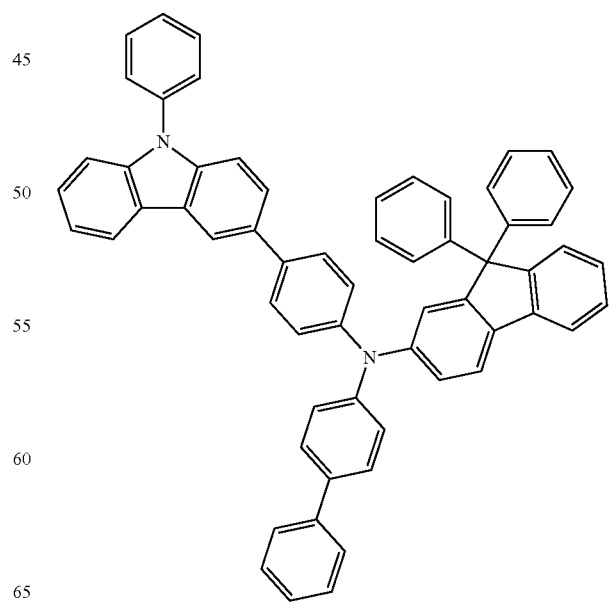

314
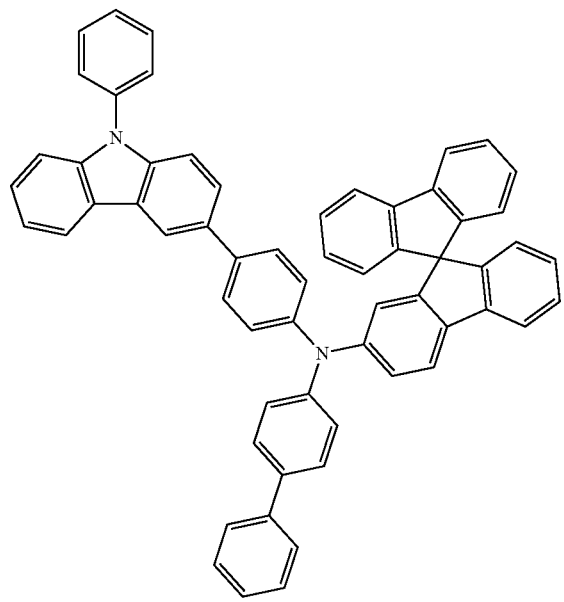
316
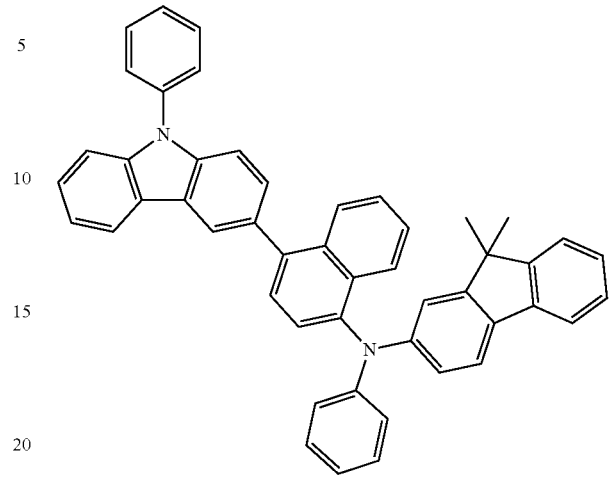
317
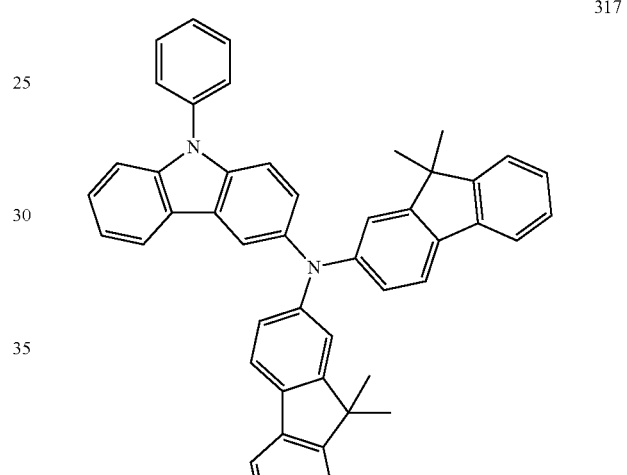
315
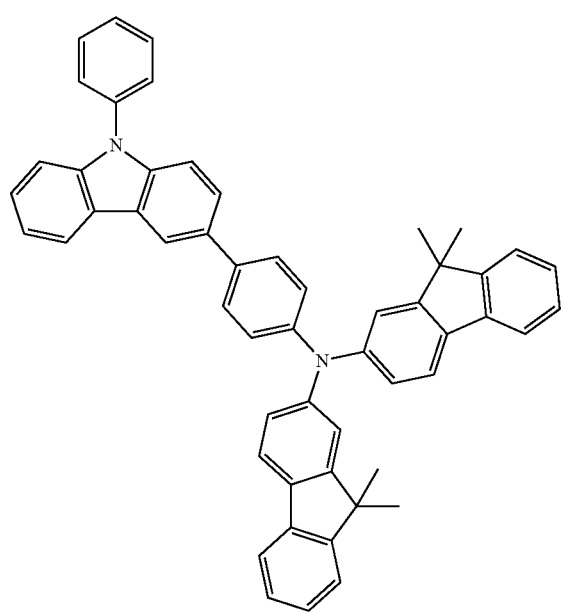
318
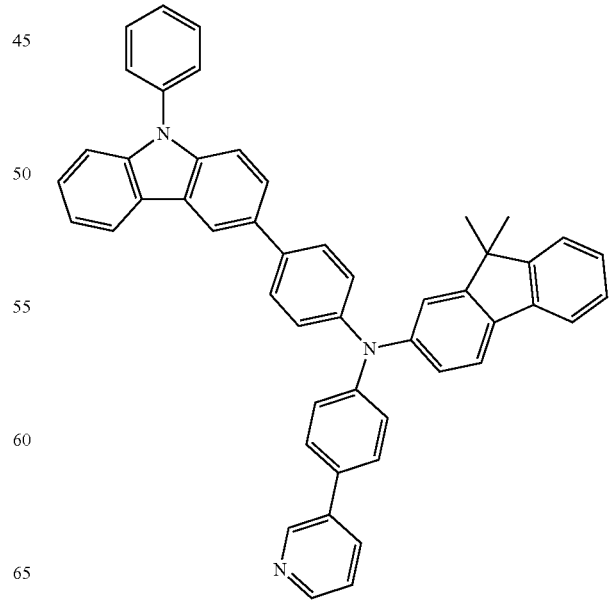

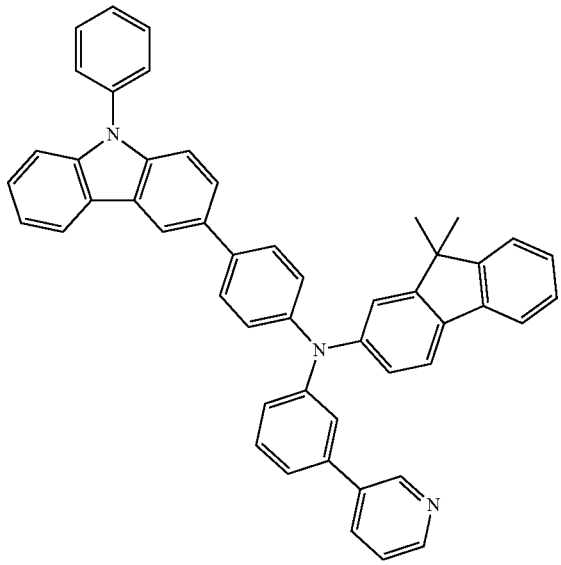

319

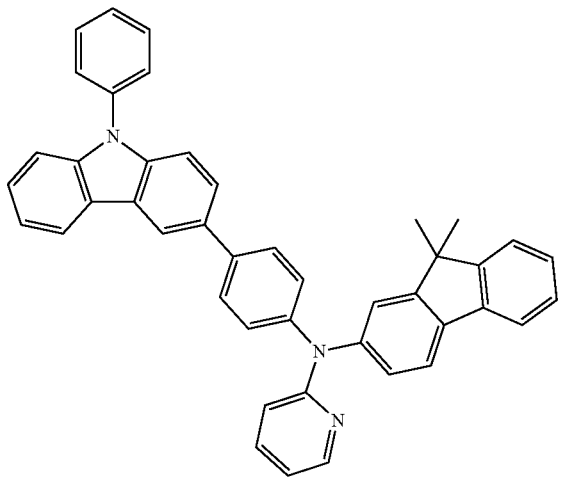

320

At least one of the hole injection layer, the hole transport layer, and the H-functional layer may further include, in addition to those known hole injection materials, those known hole transportation materials, and/or those materials having a hole injection function and a hole transportation function, a charge-generation material to improve conductivity of a film.

The charge-generation material may be, for example, p-dopant. The p-dopant may be one of a quinone derivative, a metal oxide, and a cyano-containing compound, but is not limited thereto. For example, unlimiting examples of the p-dopant are a quinone derivative, such as tetracyanoquinonedimethane (TCNQ) and 2,3,5,6-tetrafluoro-tetracyano-1,4-benzoquinonedimethane (F4-TCNQ); a metal oxide, such as tungsten oxide and molybdenum oxide; and a cyano-containing compound.

For example, Compound 200 below may be used as the cyano-containing compound, but the cyano-containing compound is not limited thereto.

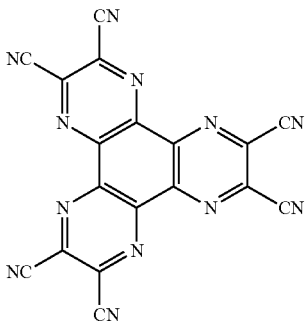

Compound 200

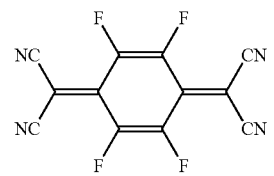

F4-TCNQ

When the hole injection layer, the hole transport layer, or the H-functional layer further includes the charge-generation material, the charge-generation material may be homogeneously or non-homogeneously dispersed in the hole injection layer, the hole transport layer, or the H-functional layer.

A buffer layer may be interposed between the emission layer and at least one of the hole injection layer, the hole transport layer, and the H-functional layer. The buffer layer may compensate for an optical resonance distance of light according to a wavelength of the light emitted from the emission layer, and thus may increase efficiency, or may control an energy level with the emission layer. The buffer layer may include a known hole injection material or a known hole transportation material. According to another embodiment of the present invention, the buffer layer may include a material that is identical to one of the materials included in the hole injection layer, the hole transport layer, and the H-functional layer formed under the buffer layer, or a host material.

An emission layer (EML) may be formed on the hole transport layer, the H-functional layer, or the buffer layer by vacuum deposition, spin coating, casting, LB deposition, or other suitable methods. When the EML is formed using vacuum deposition or spin coating, the deposition and coating conditions may be similar to those for the formation of the HIL, though the conditions for deposition and coating may vary according to the material that is used to form the EML.

The EML may include the silicon-based compound represented by Formula 1. The emission layer may include, as a luminescent material, only the silicon-based compound represented by Formula 1, or may include the silicon-based compound represented by Formula 1 and at least one compound selected from known hosts and dopants.

When the organic light-emitting diode is a full-color organic light-emitting diode, the EML may be patterned into a red emission layer, a green emission layer, and a blue emission layer. Alternatively, the emission layer may be formed by stacking at least two of the red emission layer, the green emission layer, and the blue emission layer to emit white light.

The EML may include any known dopant. For example, the EML may include a known dopant that emits red fluorescent light, red phosphorescent light, green fluorescent light, green phosphorescent light, blue fluorescent light, or blue phosphorescent light. According to an embodiment of the present invention, the emission layer may include the silicon-based compound represented by Formula 1 as a host, and a blue phosphorescent dopant emitting blue phosphorescent light, but is not limited thereto.

For example, as a blue dopant, the following compounds may be used, but the blue dopant is not limited thereto.

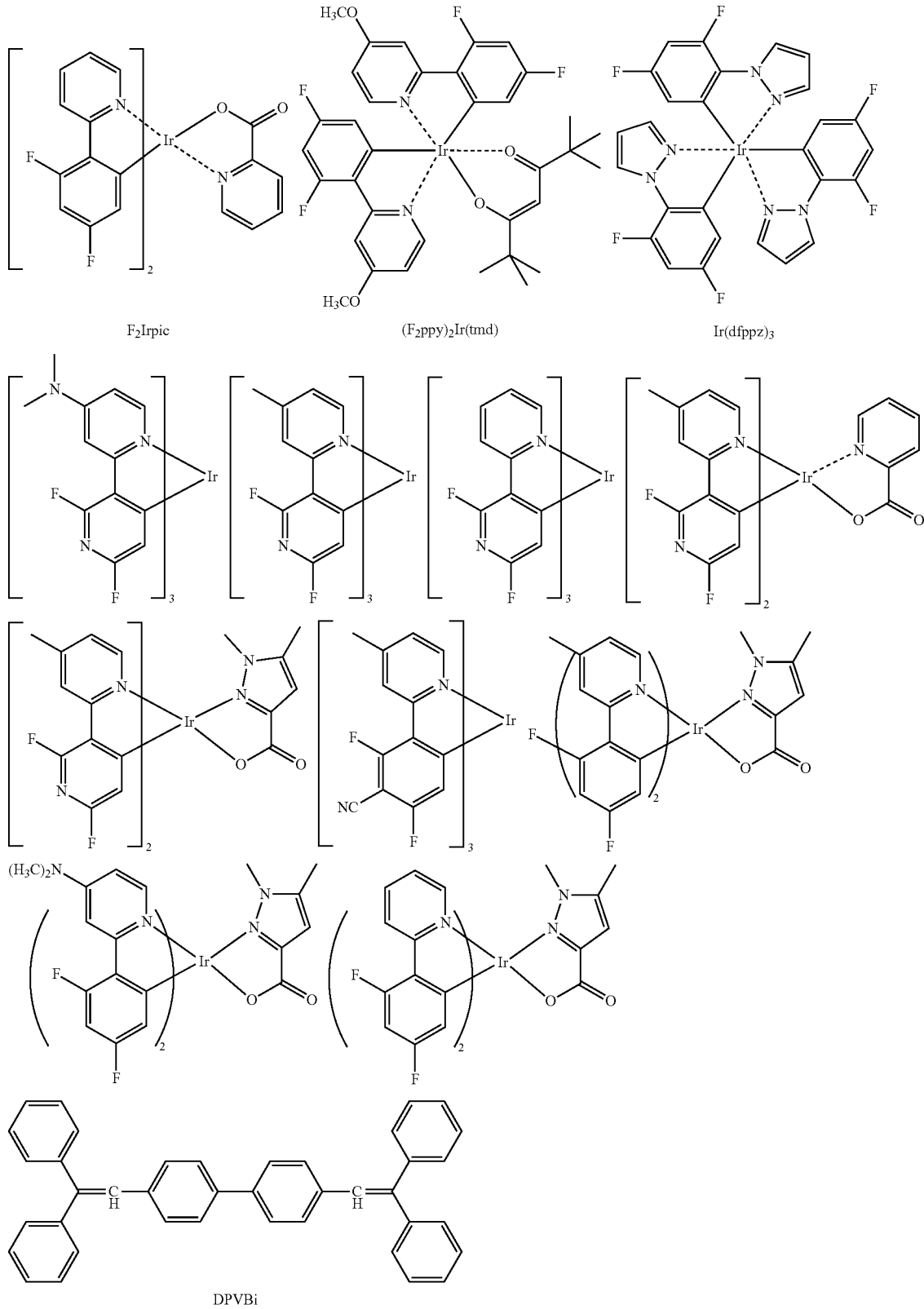

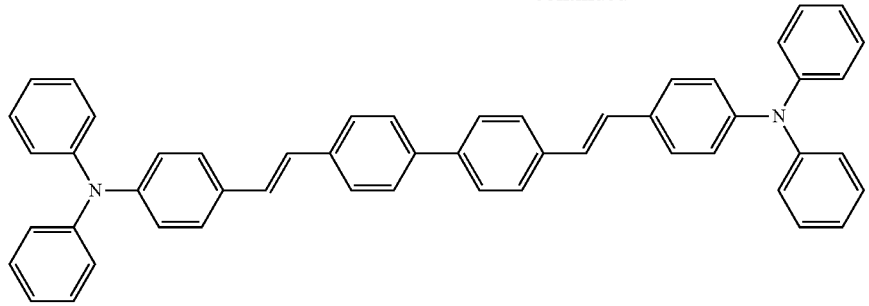
DPAVBi
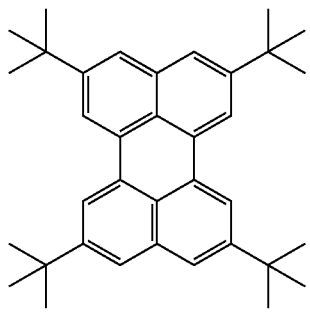
TBPe
For example, as a red dopant, the following compounds may be used, but the red dopant is not limited thereto. Alternatively, as the red dopant, DCM or DCJTB may be used.
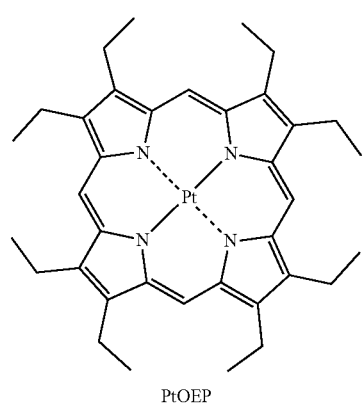
PtOEP
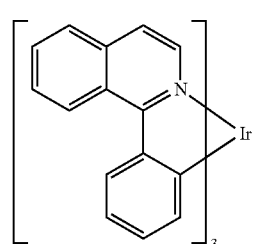
Ir(piq)$_3$
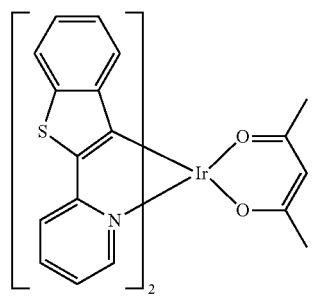
Btp$_2$Ir(acac)
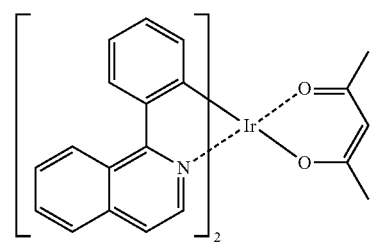
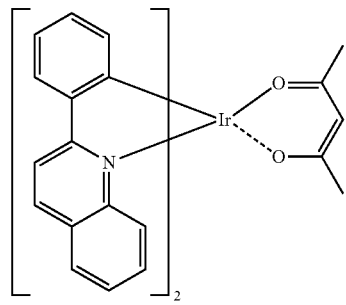
Ir(pq)$_2$(acac)

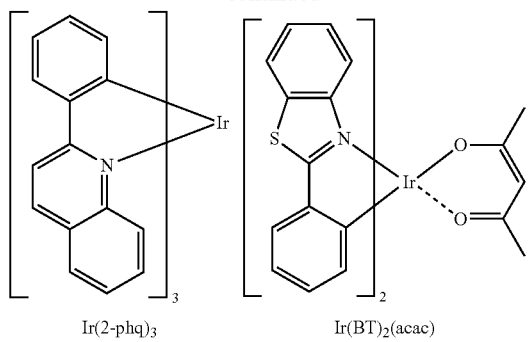
Ir(2-phq)₃
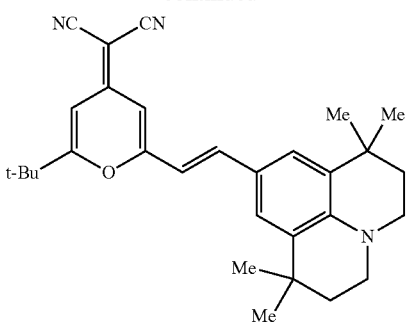
Ir(BT)₂(acac)
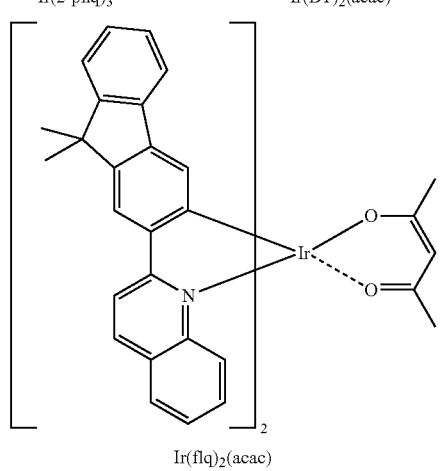
Ir(flq)₂(acac)
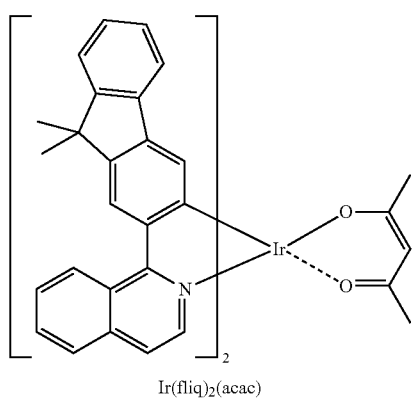
Ir(fliq)₂(acac)
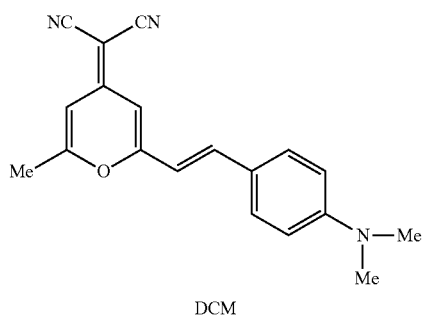
DCM
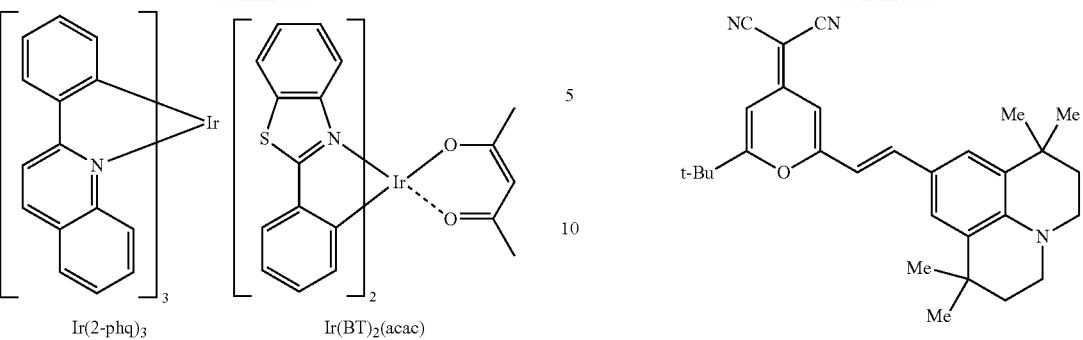
DCJTB
For example, as a green dopant, the following compounds may be used, but the green dopant is not limited thereto. According to an embodiment of the present invention, as a green dopant, C545T may be used.
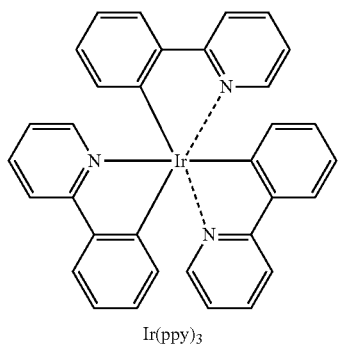
Ir(ppy)₃
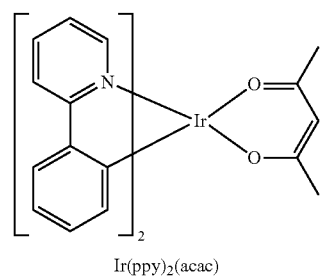
Ir(ppy)₂(acac)
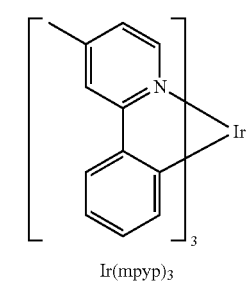
Ir(mpyp)₃

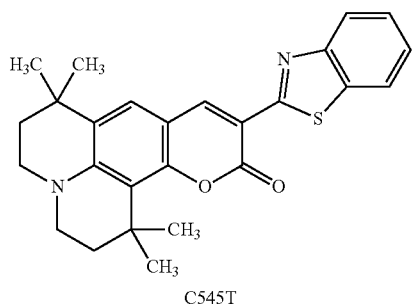
C545T
In addition, other dopants below may be used, but are not limited thereto:
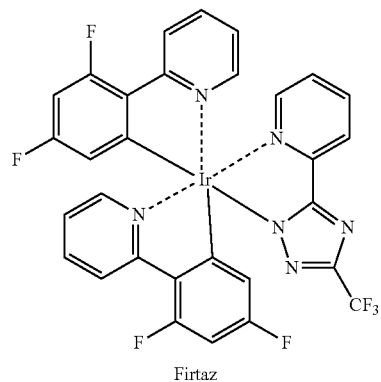
Firtaz
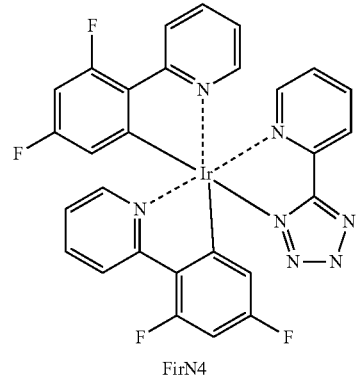
FirN4
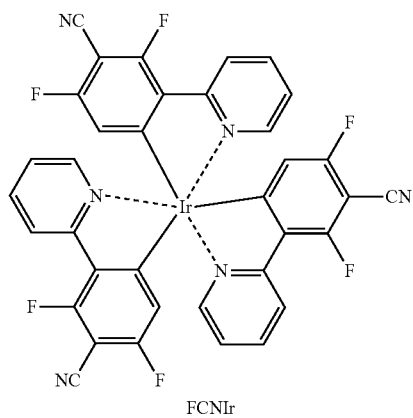
FCNIr
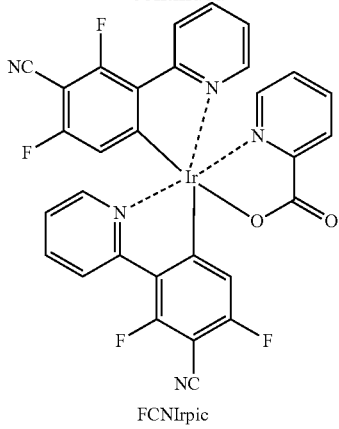
FCNIrpic
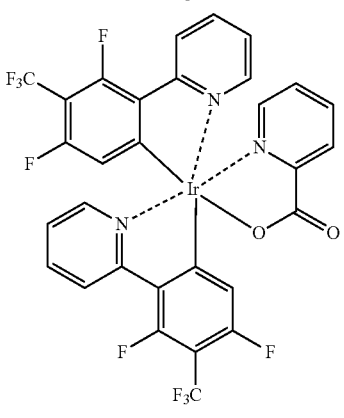
FCF3Irpic
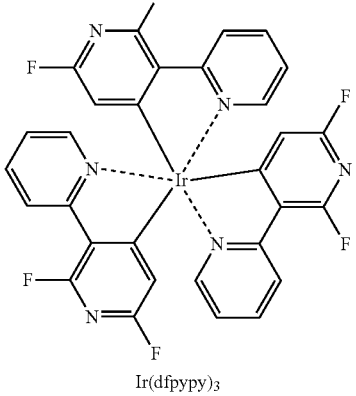
Ir(dfpypy)$_3$
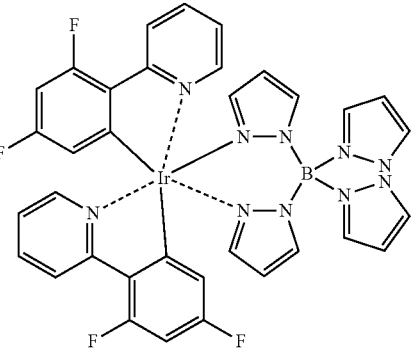
Fir6
When the EML includes both a host and a dopant, the amount of the dopant may be from about 0.01 parts to about 15 parts by weight based on 100 parts by weight of the host. However, the amount of the dopant is not limited to this range.

A thickness of the EML may be in a range of about 100 Å to about 1000 Å, for example, about 200 Å to about 600 Å. In one embodiment, when the thickness of the EML is within these ranges, the EML has improved light emitting ability without a substantial increase in driving voltage.

Next, an electron transport layer (ETL) is formed on the EML using various methods, for example, by vacuum deposition, spin coating, or casting. When the ETL is formed using vacuum deposition or spin coating, the deposition and coating conditions may be similar to those for the formation of the HIL, though the conditions for deposition and coating may vary according to the material that is used to form the ETL. As a material for the ETL, any known electron transporting material that stably transports electrons injected from an electron injection electrode (cathode) may be used. Examples of a known electron transporting material are a quinoline derivative, such as tris(8-quinolinolate)aluminum (Alq$_3$), TAZ, Balq, beryllium bis(benzoquinolin-10-olate) (Bebq$_2$), ADN, Compound 201, Compound 202, and TmPyPB, but are not limited thereto.

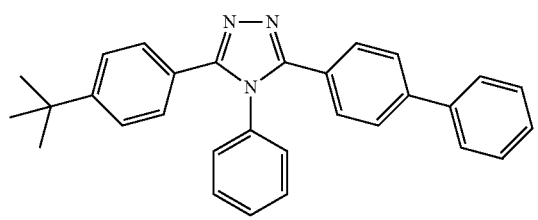

TAZ

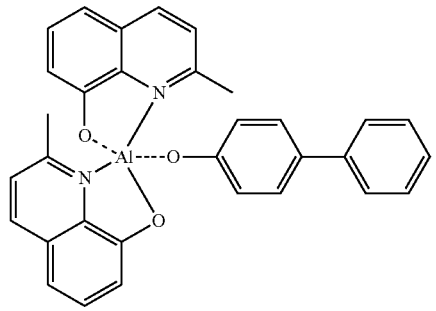

BAlq

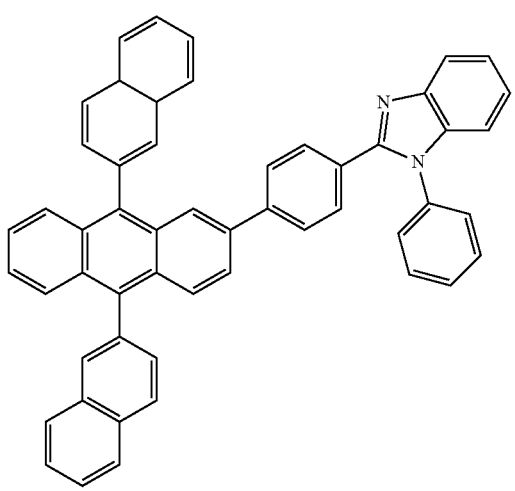

Compound 201

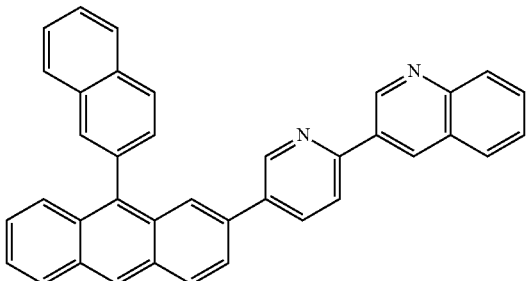

Compound 202

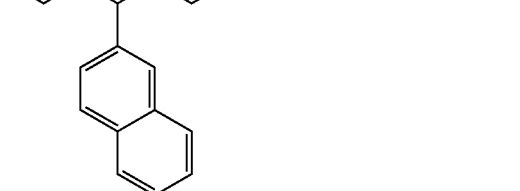

BCP

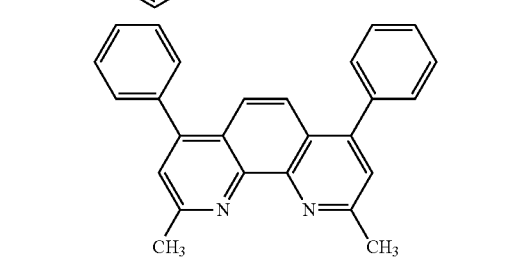

TmPyPB

A thickness of the ETL may be in a range of about 100 Å to about 1000 Å, for example, about 150 Å to about 500 Å. When the thickness of the ETL is within these ranges, the ETL may have satisfactory electron transporting ability without a substantial increase in driving voltage.

According to an embodiment of the present invention, the ETL may further include, in addition to, a known electron transporting organic compound, a metal-containing compound.

The metal-containing compound may include a Li complex. Unlimiting examples of the Li complex are lithium quinolate (LiQ) or Compound 203 below:

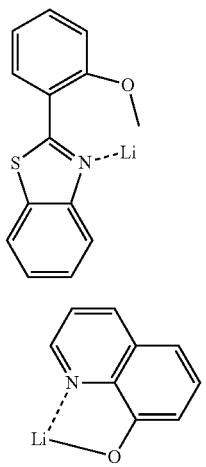

Compound 203

LiQ

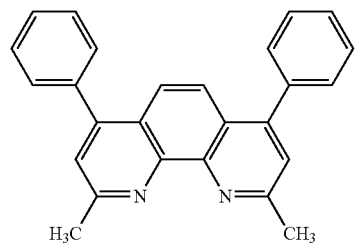

BCP

Then, an electron injection layer (EIL), which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO, which are known in the art. Deposition conditions of the EIL may be similar to those for the formation of the HIL, although the conditions may vary according to a material that is used to form the EIL.

A thickness of the EIL may be in a range of about 1 Å to about 100 Å, or about 3 Å to about 90 Å. When the thickness of the EIL is within these ranges, the EIL may have satisfactory electron transporting ability without a substantial increase in driving voltage.

A second electrode 17 is disposed on the organic layer 15. The second electrode 17 may be a cathode, which is an electron injecting electrode. A metal for forming the second electrode may be a metal, an alloy, an electrically conductive compound, which have a low-work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), or magnesium (Mg)-silver (Ag), and may be formed as a thin film type transmissive electrode. In some embodiments, to manufacture a top-emission light-emitting diode, the transmissive electrode may be formed of indium tin oxide (ITO) or indium zinc oxide (IZO).

Hereinbefore, the organic light-emitting diode 10 according to an embodiment of the present invention has been described with reference to FIG. 1, but is not limited to the structure illustrated in FIG. 1.

In addition, when the EML is formed using a phosphorescent dopant, to prevent or reduce diffusion of triplet excitons or holes toward the ETL, a hole blocking layer (HBL) may be formed between the HTL and the EML or between the H-functional layer and the EML by a method, for example, vacuum deposition, spin coating, casting, or LB. When the HBL is formed using vacuum deposition or spin coating, the deposition and coating conditions may be similar to those for the formation of the HIL, though the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, BCP illustrated below may be used as a material for the HBL.

A thickness of the HBL may be in a range of about 20 Å to about 1000 Å, for example, about 30 Å to about 300 Å. When the thickness of the HBL is within these ranges, the HBL may have improved hole blocking ability without a substantial increase in driving voltage.

Hereinafter, an organic light-emitting diode according to an embodiment of the present invention is described in detail with reference to Synthesis Examples and examples. However, the organic light-emitting diode according to an embodiment of the present invention is not limited to the Synthesis Examples and Examples.

The unsubstituted $C_1$-$C_{60}$ alkyl group (or $C_1$-$C_{60}$ alkyl group) used herein may be a $C_1$-$C_{60}$ linear or branched alkyl group, such as methyl, ethyl, propyl, isobutyl, sec-butyl, pentyl, iso-amyl, or hexyl, and the substituted $C_1$-$C_{60}$ alkyl group may be formed by substituting at least one substituent of the unsubstituted $C_1$-$C_{60}$ alkyl group with a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_6$-$C_{60}$ aryl group, a $C_2$-$C_{60}$ heteroaryl group, $-N(Q_{11})(Q_{12})$, or $-Si(Q_{13})(Q_{14})(Q_{15})$ (wherein $Q_{11}$ to $Q_{15}$ are each independently a hydrogen atom, a $C_1$-$C_{60}$ alkyl group, a $C_2$-$C_{60}$ alkenyl group, a $C_2$-$C_{60}$ alkynyl group, a $C_5$-$C_{60}$ aryl group, and a $C_2$-$C_{60}$ heteroaryl group).

The unsubstituted $C_1$-$C_{60}$ alkoxy group (or $C_1$-$C_{60}$ alkoxy group) used herein has a formula of —OA (where A is the unsubstituted $C_1$-$C_{60}$ alkyl group described above), and detailed examples thereof are methoxy, ethoxy, and isopropyloxy, and at least one hydrogen atom of these alkoxy groups may be substituted with the same substituent as described above in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon double bonds at a center or end thereof. Examples of the unsubstituted $C_2$-$C_{60}$ alkenyl group are ethenyl, prophenyl, and butenyl. At least one hydrogen atom of these unsubstituted $C_2$-$C_{60}$ alkenyl groups may be substituted with the same substituent as described above in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon triple bonds at a center or end thereof. Examples of the unsubstituted $C_2$-$C_{60}$ alkynyl group include ethynyl and propynyl. At least one hydrogen atom of these alkynyl groups may be substituted with the same substituent as described above in connection with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group include two or more rings, the rings may be fused to each other. At least one hydrogen atom of these aryl groups and arylene groups may be substituted with the same substituent as described above in connection with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, azrenyl group, a heptalenyl group, an acenaphthylenyl group, a phenalenyl group, a fluorenyl group, anthraquinolinyl group, a methylanthryl group, a phenanthryl group, a triphenylenyl group, a pyrenyl group, a chrysenyl group, an ethyl-chrysenyl group, a picenyl group, perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an ovarenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having a system composed of one or more aromatic rings having at least one hetero atom selected from nitrogen (N), oxygen (O), phosphorous (P), and sulfur (S) and carbon atoms as the remaining ring atoms. The unsubstituted $C_2$-$C_{60}$ heteroarylene group used herein refers to a divalent group having a system composed of one or more aromatic rings having at least one hetero atom selected from nitrogen (N), oxygen (O), phosphorous (P), and sulfur (S) and carbon atoms as the remaining ring atoms. In this regard, when the heteroaryl group and the heteroarylene group each include two or more rings, the rings may be fused to each other. At least one hydrogen atom of the heteroaryl group and the heteroarylene group may be substituted with the same substituent described in connection with the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, tetrazolyl, an oxadiazolyl group, a pyridinyl group, a pyridazinyl group, a pyrimidinyl group, a triazinyl group, a carbazolyl group, an indolyl group, a quinolinyl group, an isoquinolinyl group, benzoan imidazolyl group, an imidazo pyridinyl group, and an imidazo pyrimidinyl group. Examples of the unsubstituted $C_2$-$C_{60}$ heteroarylene group may be easily understood by referring to the examples of the substituted or unsubstituted $C_2$-$C_{60}$ arylene group.

The substituted or unsubstituted $C_6$-$C_{60}$ aryloxy group indicates—$OA_2$ (where $A_2$ is the substituted or unsubstituted $C_6$-$C_{60}$ aryl group), and the substituted or unsubstituted $C_5$-$C_{60}$ arylthio group indicates—$SA_3$ (where $A_3$ is the substituted or unsubstituted $C_6$-$C_{60}$ aryl group).

EXAMPLE

Synthesis Example 1

Synthesis of Compound 2

Compound 2 was synthesized according to Reaction Scheme 1:

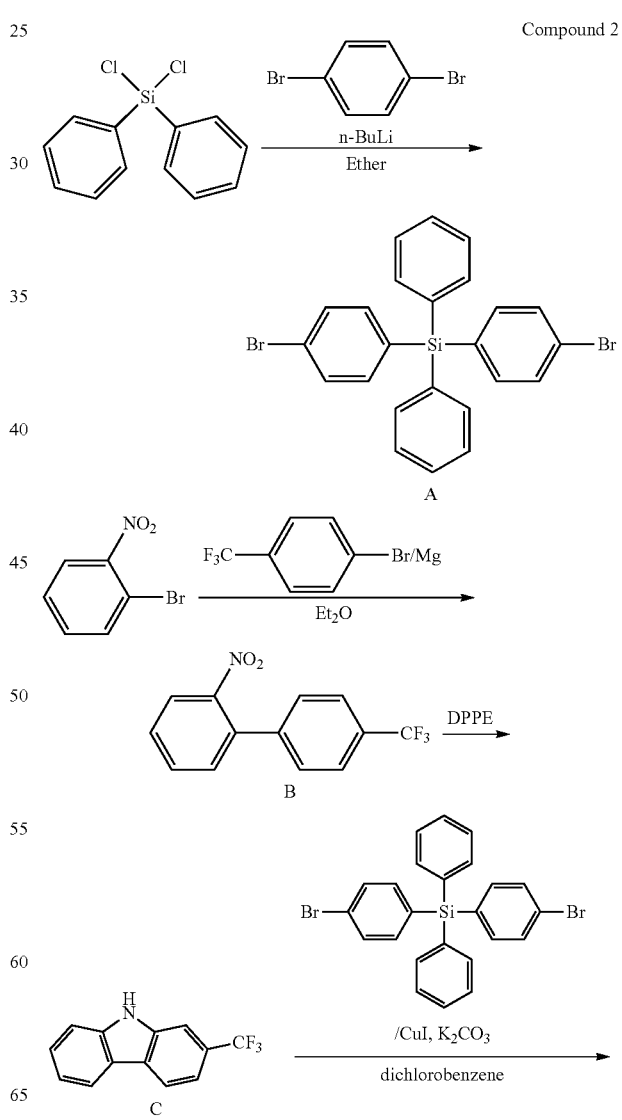

Reaction Scheme 1

-continued

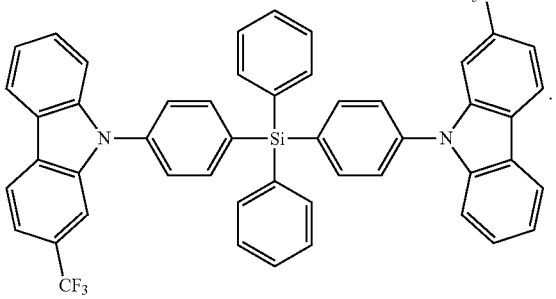

Synthesis of Intermediate A 11.8 g (50 mmol) of 1,4-dibromobenzene and 100 mL of purified diethyl ether were added to a 500 mL 3-neck flask and then stirred under $N_2$ stream. The reaction mixture was cooled in a cooling water bath (EtOAc/Liq-$N_2$ bath) to a temperature of −78° C., and then, n-BuLi (2.5 M, 10 mL, 25 mmol) was added thereto. Under nitrogen stream, the mixture was stirred for 1 hour, and then, 6.33 g (25 mmol) of dichlorodiphenylsilane was added thereto and the temperature was slowly raised and then, the result was stirred at room temperature for 12 hours, and 100 mL of water was added thereto to stop the reaction. The reaction product was extracted with diethyl ether (100 ml×3) and then water was removed therefrom by using an anhydrous $MgSO_4$ and a solvent was removed therefrom by using a rotation evaporator. The result was separated by column chromatography (n-hexane/EA; 20/1) to obtain Intermediate A (white solid, 10.1 g, 81.6%).

$^1$H NMR (300 MHz, $CDCl_3$) δ 7.53 (m, 8H), 7.41 (m, 10H).

Synthesis of Intermediate B 1.2 g (49.5 mmol) of Mg and 80 mL of purified diethyl ether were added to a 250 mL 3-neck flask, and then, the temperature of the mixture was lowered in an ice-bath to 0° C., and then 11.1 g (49.5 mmol) of 1-bromo-4-(trifluoromethyl)benzene was slowly added thereto, and the mixture was stirred for 1 hour to prepare a Grignard reagent. 10 g (49.5 mmol) of 1-bromo-2-nitrobenzene, 0.5 g (1 mmol) of and Ni(dppp)$Cl_2$, and 200 mL of purified diethyl ether were added to a 500 mL 3-neck flask, and the reaction materials were stirred in an ice-bath while the temperature was maintained at 0° C., and the Grignard reagent was slowly dropped thereto and the mixture was stirred for 12 hours, and then, 2N HCl was added thereto to stop the reaction. The reaction product was washed with 250 mL of ethyl acetate, and then, water was removed therefrom by using an anhydrous $MgSO_4$ and then a solvent was removed therefrom by using a rotation evaporator. The result was separated by column chromatography (petroleum ether/EA; 7/1) to obtain Intermediate B (yellow solid, 7.1 g, 54%).

$^1$H NMR (300 MHz, $CD_2Cl_2$) d 7.98 (dd, 1H), 7.75-7.71 (m, 3H), 7.63 (m, 1H), 7.56-7.47 (m, 3H).

Synthesis of Intermediate C 2 g (7.49 mmol) of 2-nitro-4'-trifluoromethylbiphenyl (Intermediate B) and 3.24 g (8.24 mmol) of 1,2-bis(diphenylhosphino)ethane (DPPE) were added to a 10 mL 2-neck flask, and then, under $N_2$ stream, the reaction was performed at the temperature of 150° C. for 5 hours, and then, the reaction product was cooled to room temperature. The result was separated by column chromatography (petroleum ether/ EA; 2/1) to obtain Intermediate C (white solid, 1.5 g, 85%).

$^1$H NMR (300 MHz, $CD_2Cl_2$) d 11.64 (s, 1H), 8.34 (d, 1H), 8.23 (d, 1H), 7.82 (s, 1H), 7.60 (d, 1H), 7.48 (m, 2H), 7.24 (t, 1H).

Synthesis of Compound 2

1 g (4.3 mmol) of 2-(trifluoromethyl)-9H-carbazole (Intermediate C), 0.99 g (2.0 mmol) of dibromophenyldiphenylsilane (Intermediate A), 20 mg (0.1 mmol) of CuI, 40 mg (0.15 mmol) of 18-crown-6 ether, and 0.41 g (3 mmol) of $K_2CO_3$ were added to a 100 mL 2-neck flask, and then, under $N_2$ stream, the mixture was stirred for 30 minutes, and then, 4 mL of 1,2-dichlorobenzene was added thereto, and the result was refluxed at the temperature of 180° C. for 48 hours. Then, the refluxed result was extracted with 100 mL of ethyl acetate, and then, water was removed therefrom by using an anhydrous $MgSO_4$ and then a solvent was removed therefrom by using a rotation evaporator. The result was separated by column chromatography (petroleum ether/n-hexane; 7/1) to obtain Compound 2 (white solid, 0.76 g, 47%).

$^1$H NMR (300 MHz, DMSO-d6) δ 8.52 (d, 2H), 8.40 (d, 2H), 7.93 (d, 4H) 7.83 (d, 4H), 7.73-7.66 (m, 8H), 7.63-7.55 (m, 10H), 7.42-7.37 (m, 2H). MS(FAB) m/z 803.22 [(M+1)$^+$]

Evaluation Example 1

Characteristics of Compound 2

Thermal Characteristics of Compound 2

Figure 2:
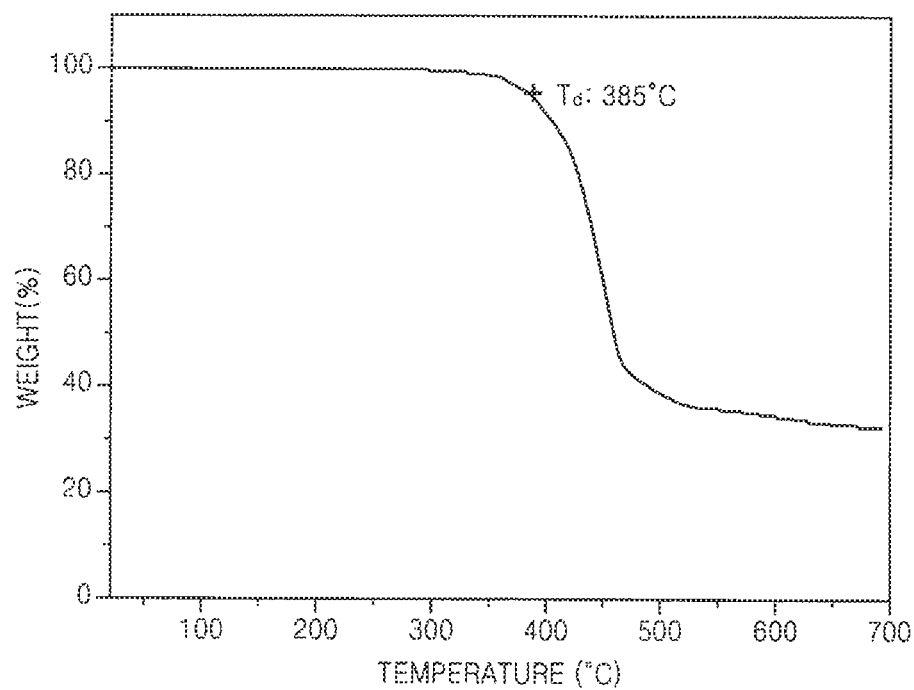
FIG. 2 is a graph showing the result of Thermogravimetric Analysis (TGA) characterization of Compound 2.
Figure 3:
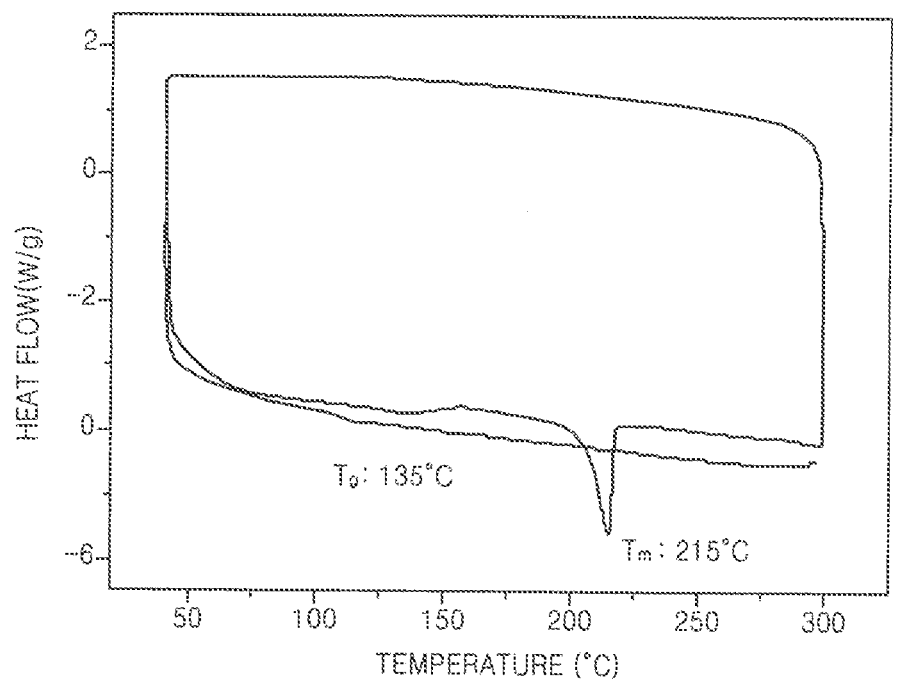
FIG. 3 is a graph showing the result of Differential Scanning calorimetry (DSC) characterization of Compound 2.

Thermal analysis ($N_2$ atmosphere, a temperature range of room temperature to 600° C. (10° C./min)-Thermogravimetric Analysis (TGA), a temperature range of room temperature to 400° C.-Differential Scanning calorimetry (DSC), Pan Type: Pt Pan in disposable Al Pan (TGA), disposable Al pan (DSC)) was performed on Compound 2 by using Thermogravimetric Analysis (TGA) and Differential Scanning calorimetry (DSC), and results thereof are shown in FIGS. 2 and 3. Referring to FIGS. 2 and 3, thermal stability of Compound 2 was confirmed.

Spectroscopic Characteristics of Compound 2

Figure 4:
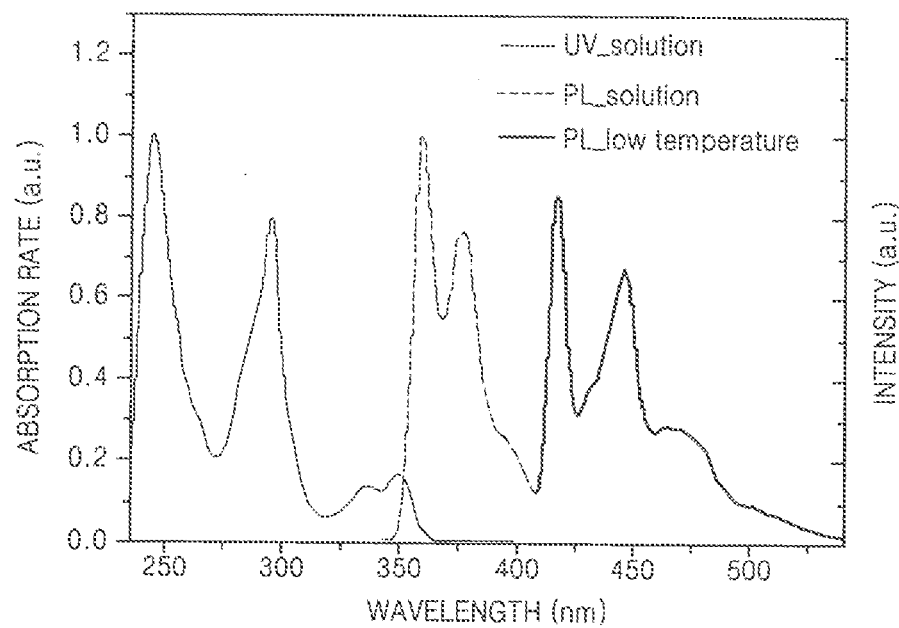
FIG. 4 shows the ultraviolet (UV) absorption spectrum and the photoluminescence (PL) spectrum of Compound 2.

Ultraviolet (UV) absorption spectrum and photoluminescence (PL) spectrum of Compound 2 were evaluated, and results thereof are shown in FIG. 4. The three plots of FIG. 4 were measured by using the following methods.

TABLE 1

| | |
|---|---|
| "UV_solution" graph | Compound 2 was diluted at a concentration of 1 × 10$^{-5}$M in $CHCl_3$, and then a UV absorption spectrum thereof was measured at room temperature by using Shimadzu UV-350 Spectrometer. |
| "PL_solution" graph | Compound 2 was diluted at a concentration of 1× 10$^{-5}$M in $CHCl_3$, and PL thereof was measured at room temperature by using ISC PC1 spectrofluorometer equipped with a Xenon lamp. |
| "PL_low temperature" graph | Compound 2 was diluted at a concentration of 1 × 10$^{-5}$M in $CHCl_3$, and PL thereof was measured at a low temperature (77 K) by using by using ISC PC1 spectrofluorometer equipped with a Xenon lamp. |

Referring to FIG. 4, it was confirmed that Compound 2 has spectroscopic characteristics suitable for use as a material for an organic light-emitting diode.

Electrochemical Characteristics of Compound 2

Characteristics of Compound 2 were measured by using cyclic voltammetry (CV) (electolyte: 0.1 M Bu$_4$NClO$_4$/ solvent: $CH_2Cl_2$/electrode: 3 electrode system (working electrode: GC, reference electrode: Ag/AgCl, auxiliary electrode: Pt)), and results thereof are shown in FIG. 5.

HOMO and LUMO Energy Levels of Compound 2

Figure 5:
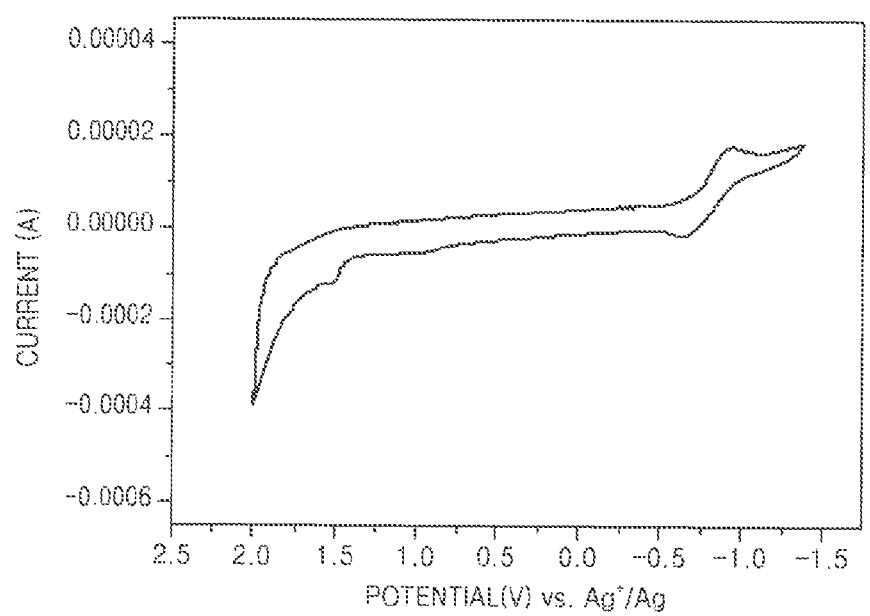
FIG. 5 is a graph showing the result of cyclic voltammetry (CV) measurement of Compound 2.
Figure 6:
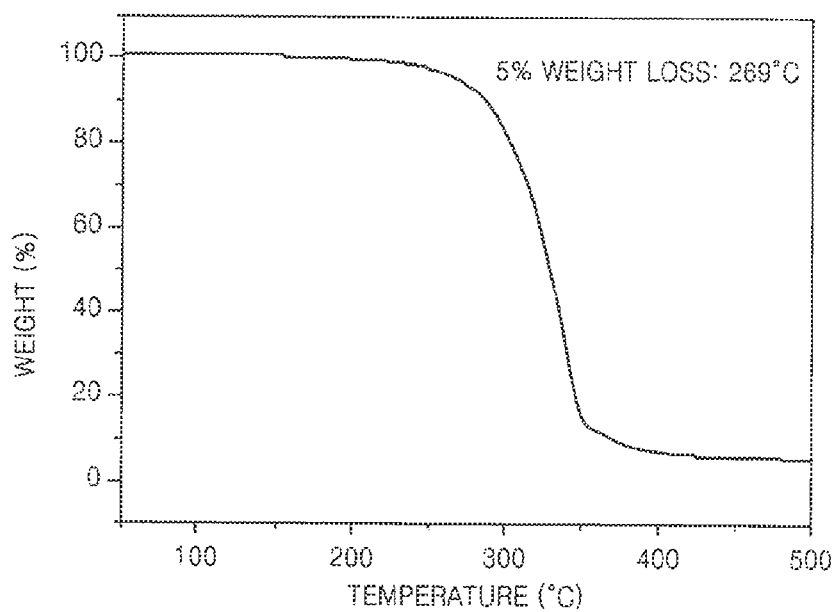
FIG. 6 is a graph showing the result of Thermogravimetric Analysis (TGA) characterization of Compound 4.
Figure 7:
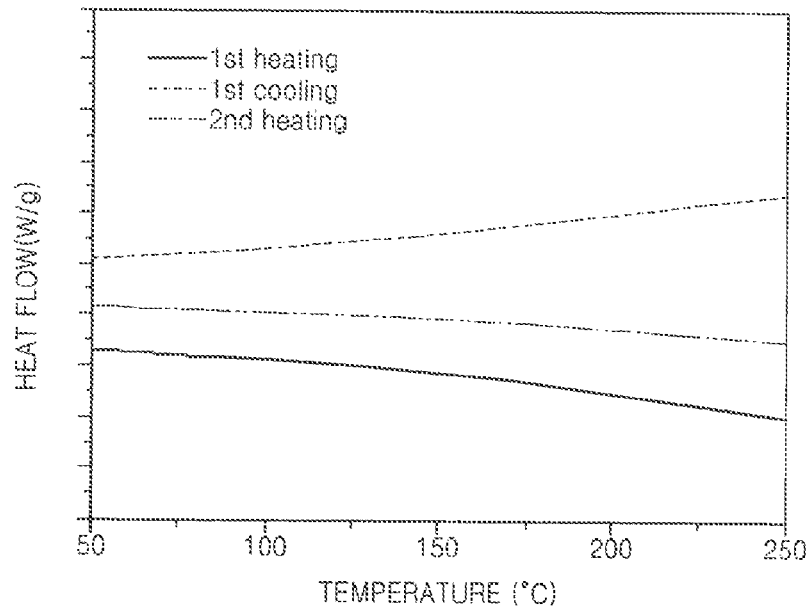
FIG. 7 is a graph showing the result of Differential Scanning calorimetry (DSC) characterization of Compound 4.
Figure 8:
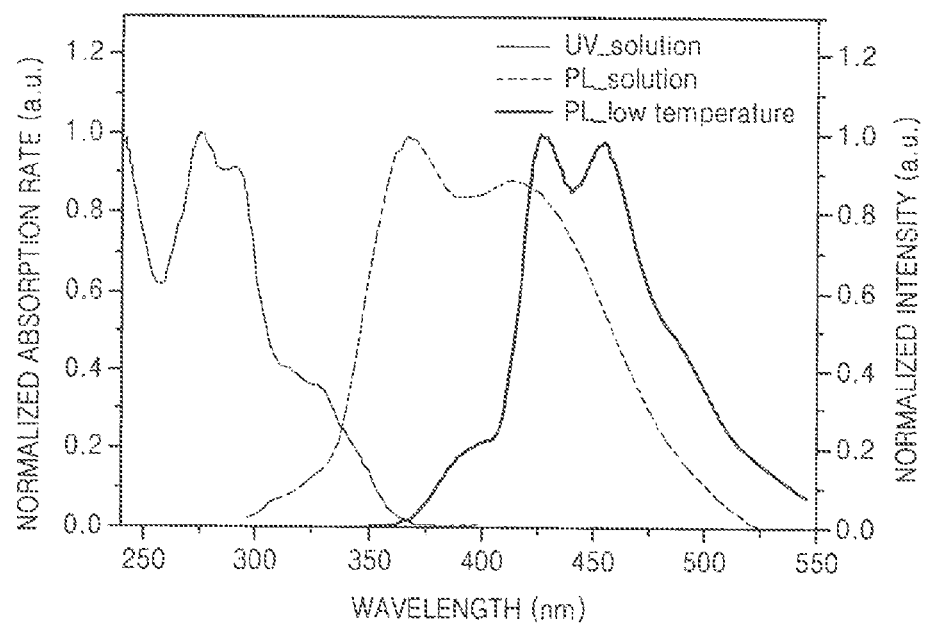
FIG. 8 shows the ultraviolet (UV) absorption spectrum and the photoluminescence (PL) spectrum of Compound 4.
Figure 9:
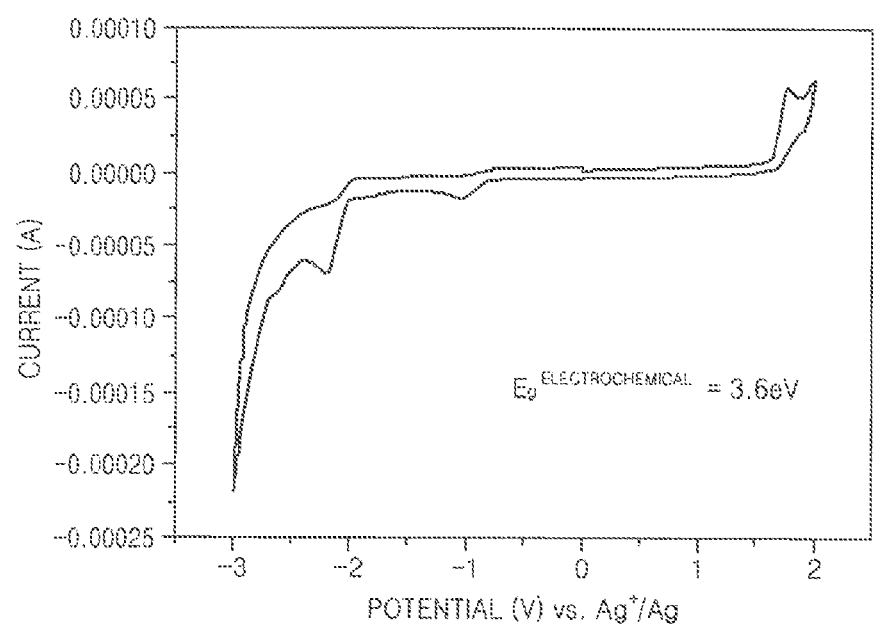
FIG. 9 is a graph showing the result of cyclic voltammetry (CV) measurement of Compound 4.

A LUMO energy level of Compound 2 was measured from reduction onset of FIG. 5, and a HOMO energy level thereof was measured from an optical band gap (Eg) of an edge of the UV absorption spectrum of FIG. 4, and results thereof are shown in Table 2. For comparison, data obtained from the TGA and DSC plots are also shown in Table 2 (the HOMO energy level and the LUMO energy level are indicated as an absolute value):

TABLE 2

| Td (° C.) | Tg (° C.) | Tm (° C.) | HOMO (eV) | LUMO (eV) | Eg (eV) | $E_T$ (eV) |
|---|---|---|---|---|---|---|
| 385 | 135 | 215 | 5.80 | 2.37 | 3.43 | 2.97 |

Synthesis Example 2

Synthesis of Compound 4

Compound 4 was synthesized according to Reaction Scheme 2:

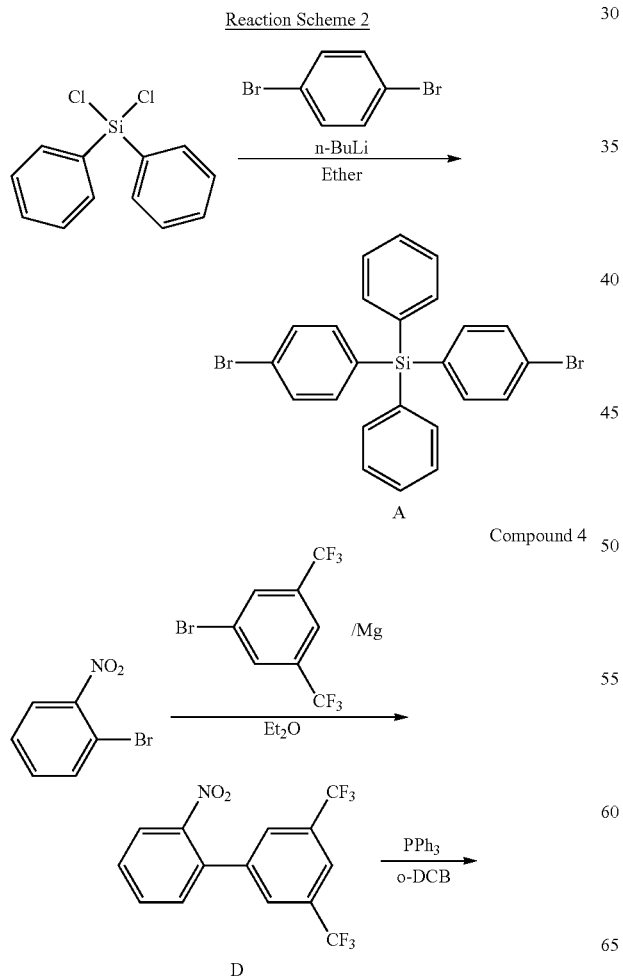

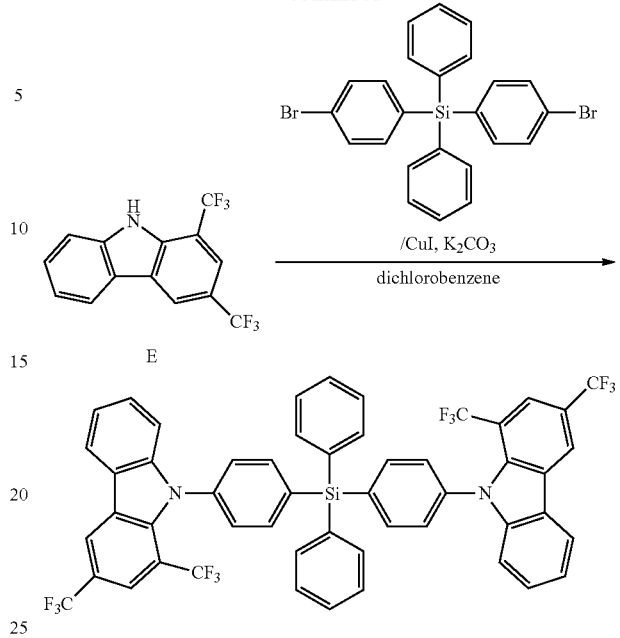

Synthesis of Intermediate D

Intermediate D (yellow solid, 5.2 g, 31%) was obtained in the same manner as used to synthesize Intermediate B, except that 14.5 g (49.5 mmol) of 1-bromo-3,5-bis(trifluoromethyl)benzene was used instead of 1-bromo-4-(trifluoromethyl)benzene.

$^1$H NMR (300 MHz, CD$_2$Cl$_2$) 7.81 (d, 1H), 7.51-7.55 (m, 3H), 7.39-7.31 (m, 1H), 7.19 (s, 1H).

Synthesis of Intermediate E

Intermediate E (white solid, 1.1 g, 51%) was obtained in the same manner as used to synthesize Intermediate C, except that 2.34 g (7.0 mmol) of Intermediate D was used instead of Intermediate B.

$^1$H NMR (300 MHz, CD$_2$Cl$_2$) 8.67 (s, 1H), 7.72 (d, 1H), 7.41 (d, 2H), 7.33 (s, 2H), 7.15-7.10 (m, 1H).

Synthesis of Compound 4

Intermediate E (white solid, 0.82 g, 44%) was obtained in the same manner as used to synthesize Compound 2, except that Intermediate E was used instead of Intermediate C.

$^1$H NMR (300 MHz, DMSO-d6) 7.77-7.73 (m, 2H), 7.57-7.22 (m, 23H), 7.04-7.00 (m, 5H). MS(FAB) m/z 939.20 [(M+1)$^+$]

Evaluation Example 2

Characteristics of Compound 4

Thermal characteristics, spectroscopic characteristics, electrochemical characteristics, and HOMO and LUMO energy levels of Compound 4 were evaluated in the same manner as in Evaluation Example 1, and results thereof are shown in FIGS. 6 to 9 and Table 3 below:

TABLE 3

| Td (° C.) | Tg (° C.) | Tm (° C.) | HOMO (eV) | LUMO (eV) | Eg (eV) | ET (eV) |
|---|---|---|---|---|---|---|
| 269 | — | — | 5.80 | 2.37 | 3.43 | 2.97 |

From FIGS. 6 to 9 and Table 3, it was confirmed that Compound 4 has thermal characteristics, spectroscopic characteristics, and electrochemical characteristics, suitable for use as a material for an organic light-emitting diode.

Synthesis Example 3

Synthesis of Compound 6

Compound 6 was synthesized in the same manner as in Synthesis Example 1, except that 1-bromo-3,5-bis(trifluoromethyl)benzene and 1-bromo-4-(trifluoromethyl)-2-nitrobenzene were used instead of 1-bromo-4-(trifluoromethyl)benzene and 1-bromo-2-nitrobenzene in synthesizing Intermediate B.

Synthesis Example 4

Synthesis of Compound 9

Compound 9 was synthesized in the same manner as in Synthesis Example 1, except that 1-bromo-3,5-bis(trifluoromethyl)benzene and 2-bromo-4-(trifluoromethyl)-1-nitrobenzene were used instead of 1-bromo-4-(trifluoromethyl)benzene and 1-bromo-2-nitrobenzene in synthesizing Intermediate B.

Synthesis Example 5

Synthesis of Compound 10

Compound 10 was synthesized in the same manner as in Synthesis Example 1, except that 1-bromo-3-(trifluoromethyl)benzene and 2-bromo-4-(trifluoromethyl)-1-nitrobenzene were used instead of 1-bromo-4-(trifluoromethyl)benzene and 1-bromo-2-nitrobenzene in synthesizing Intermediate B.

Comparative Synthesis Example 1

Synthesis of Compound A

Compound A was synthesized in the same manner as in Synthesis Example 1, except that bromobenzene was used instead of 1-bromo-2-nitrobenzene in synthesizing Intermediate B.

Compound A

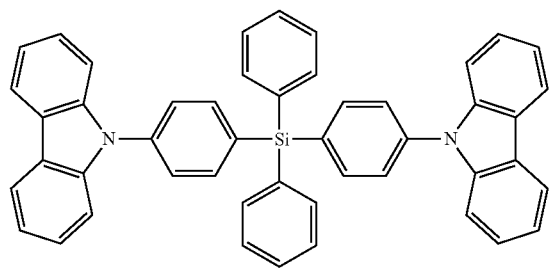

Evaluation Example 3

Characteristics of Compounds A, 6, 9 and 10

Spectroscopic characteristics, HOMO and LUMO energy levels of Compound A, 6, 9 and 10 were evaluated through simulation, and results thereof are shown in Table 4 below.

TABLE 4

| | UV absorption maximum wavelength (nm) | PL absorption maximum wavelength (nm) | Eg (eV) | $E_T$ (eV) | HOMO (eV) | LUMO (eV) |
|---|---|---|---|---|---|---|
| Compound A | 292, 320, 335 | 347, 361 | 3.53 | 3.03 | 5.59 | 2.06 |
| Compound 6 | 240, 264, 295, 322 | 36 | 3.54 | 3.00 | 5.93 | 2.39 |
| Compound 9 | 242, 262, 293, 325 | 357 | 3.53 | 3.03 | 6.02 | 2.49 |
| Compound 10 | 256, 291, 320, 332 | 342, 354 | 3.65 | 3.05 | 5.92 | 2.27 |

Referring to Tables 2, 3 and 4, although Eg (energy band gap) of Compounds 2, 4, 6, 9, and 10 is equivalent to or higher than Eg of Compound A, HOMO and LUMO energy level absolute values of Compounds 2, 4, 6, 9, and 10 are all higher than HOMO and LUMO energy level absolute values of Compound A. Therefore, it was confirmed that Compounds 2, 4, 6, 9, and 10 are suitable for use as a host in a material for an organic light-emitting diode, for example, a host of an emission layer.

Example 1

A Corning 15 Ωcm$^{-2}$ (1200 Å) ITO glass substrate was cut to a size of 50 mm×50 mm×0.7 mm, ultrasonically cleaning the glass substrate using isopropyl alcohol and pure water for 5 minutes each, and then irradiating UV light for 30 minutes and exposing to ozone to clean. Then, the glass substrate was loaded into a vacuum deposition apparatus.

DNTPD was deposited on the ITO layer, which is an anode, to form a hole injection layer having a thickness of 600 Å, and then, 4,4'-bis[N-(1-naphthyl)-N-phenylamino]biphenyl (NPB) was deposited on the hole injection layer to form a hole transport layer having a thickness of 100 Å.

mCP was deposited on the hole transport layer to form a buffer layer having a thickness of 200 Å, and Compound 2 (blue phosphorescent host) and FCNIr (blue phosphorescent dopant) were co-deposited on the buffer layer at a weight ratio of 90:10 to form an emission layer having a thickness of 200 Å.

Subsequently, Compound TmPyPB was deposited on the emission layer to form an electron transport layer having a thickness of 300 Å, and then, LiF was deposited on the electron transport layer to form an electron injection layer having a thickness of 10 Å, and Al was deposited on the electron injection layer to form a second electrode having a thickness of 3000 Å (cathode), thereby completing the manufacturing of an organic light-emitting diode.

DNTPD
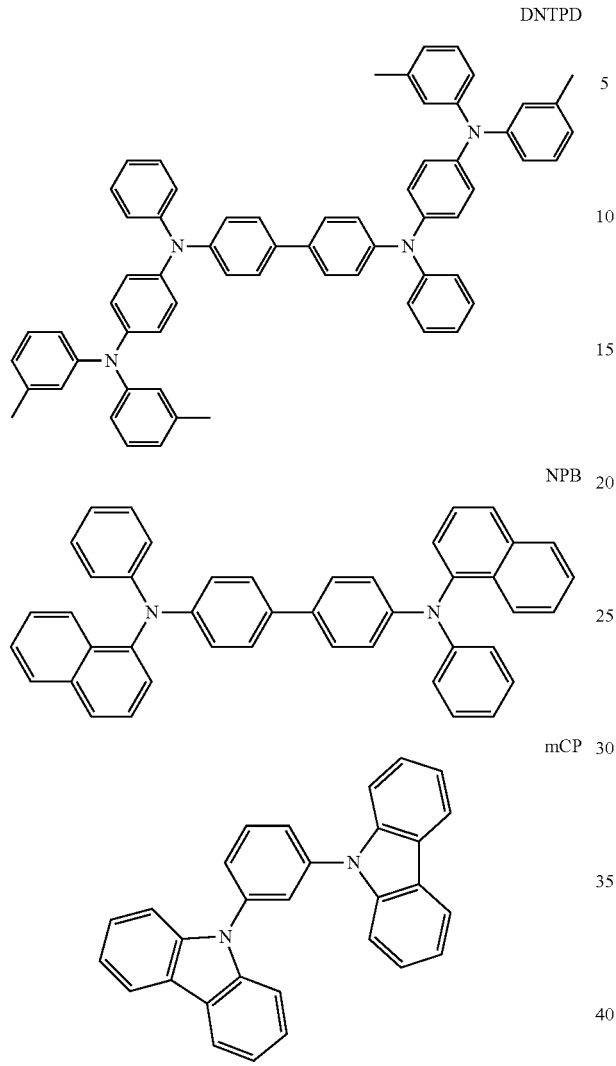
NPB
mCP
Compound 2
FCNIr
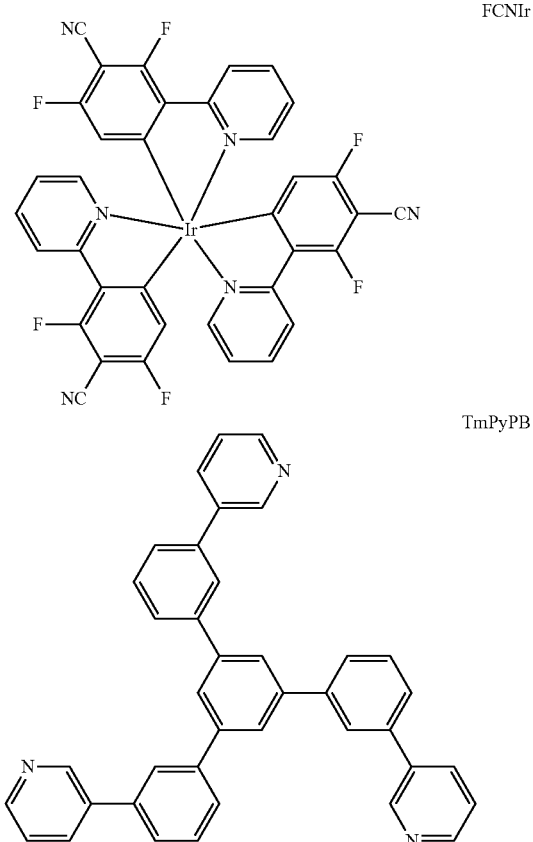
TmPyPB
Example 2
An organic light-emitting diode was manufactured in the same manner as in Example 1, except that Compound 4 was used instead of Compound 2 in forming the emission layer.
Compound 4
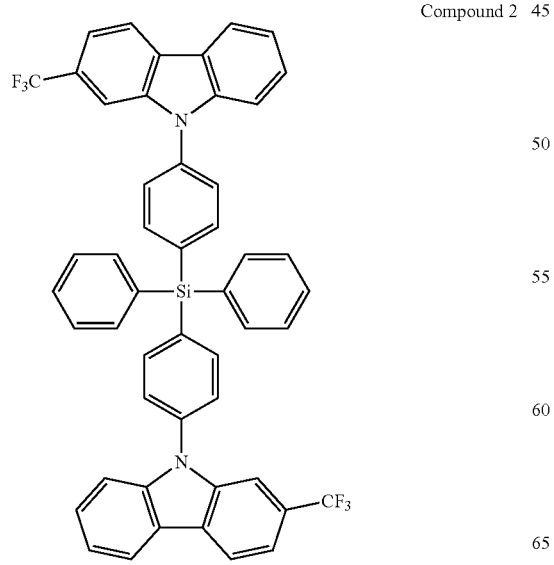
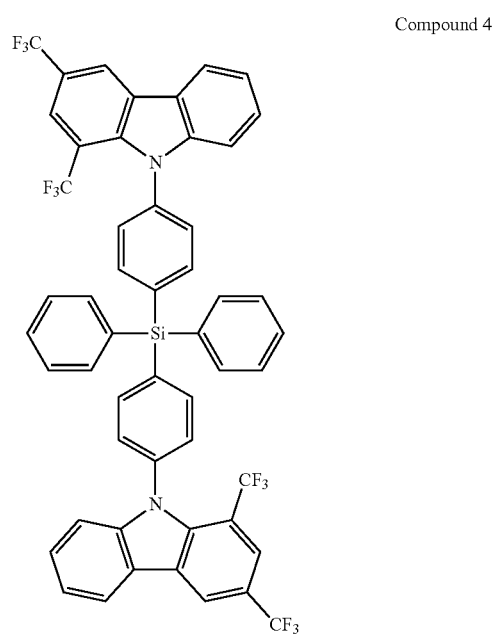 [SMILES: FC(F)(F)c1cc(C(F)(F)F)c2c(c1)c1ccccc1n2-c1ccc([Si](c2ccccc2)(c2ccccc2)c2ccc(-n3c4ccccc4c4cc(C(F)(F)F)cc(C(F)(F)F)c43)cc2)cc1]

Comparative Example 1

An organic light-emitting diode was manufactured in the same manner as in Example 1, except that Compound A was used instead of Compound 2 in forming the emission layer.

Compound A

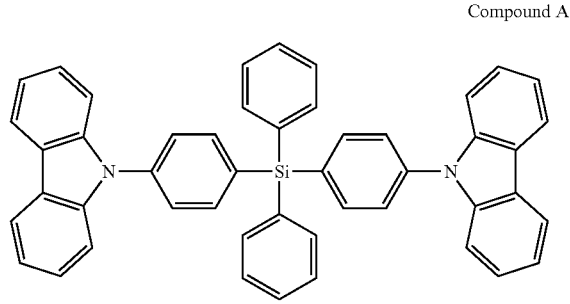 [SMILES: c1ccc([Si](c2ccccc2)(c2ccc(-n3c4ccccc4c4ccccc43)cc2)c2ccc(-n3c4ccccc4c4ccccc43)cc2)cc1]

Comparative Example 2

An organic light-emitting diode was manufactured in the same manner as in Example 1, except that Compound B was used instead of Compound 2 in forming the emission layer.

Compound B

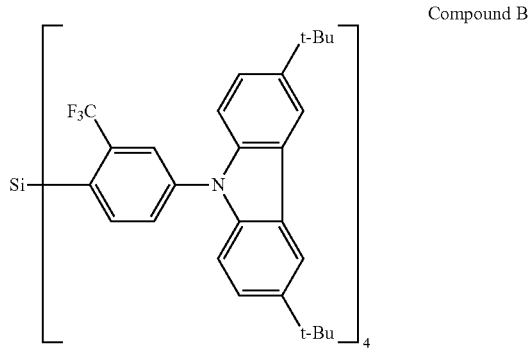

Comparative Example 3

An organic light-emitting diode was manufactured in the same manner as in Example 1, except that Compound C was used instead of Compound 2 in forming the emission layer.

Compound C

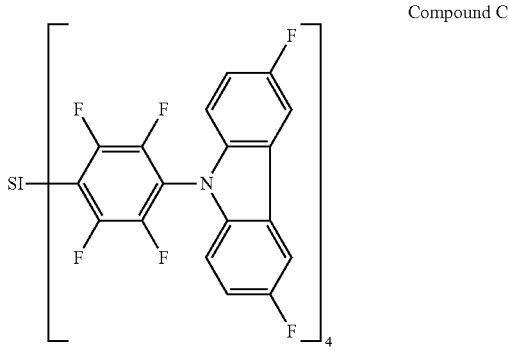

Characteristics of the organic light-emitting diodes of Examples 1 and 2 and Comparative Examples 1 to 3 are summarized in Table 5 below (driving voltage, brightness, efficiency, and color purity were measured by using Kethley SMU 236).

TABLE 5

| | Emission layer material | Driving voltage [V] | Current density [mA/cm$^2$] | Brightness [cd/m$^2$] | Efficiency [cd/A] | CIE x | CIE y |
|---|---|---|---|---|---|---|---|
| Example 1 | Compound 2 | 6.4 | 19 | 100 | 15.1 | 0.147 | 0.192 |
| Example 2 | Compound 4 | 6.7 | 24 | 100 | 16.7 | 0.147 | 0.195 |
| Comparative Example 1 | Compound A | 6.5 | 15 | 100 | 5.2 | 0.147 | 0.197 |
| Comparative Example 2 | Compound B | 6.6 | 16 | 100 | 5.5 | 0.149 | 0.201 |
| Comparative Example 3 | Compound C | 6.5 | 17 | 100 | 4.2 | 0.150 | 0.193 |

From Table 5, it was confirmed that the organic light-emitting diode of Examples 1 and 2 have lower driving voltage and higher current density, efficiency, and lifetime characteristics, and better color purity characteristics than the organic light-emitting diodes of Comparative Examples 1 to 3.

An organic light-emitting diode including the silicon-based compound according to an embodiment of the present invention may have low driving voltage, high efficiency, high color purity, and long lifetime.

While aspects of the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A silicon-based compound represented by Formula 1:

Formula 1

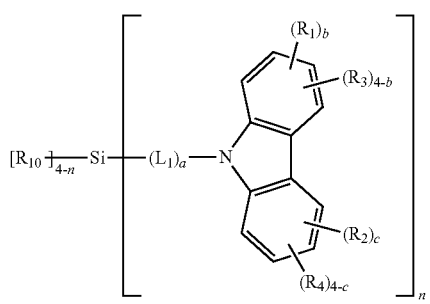

$L_1$ is a substituted or unsubstituted $C_6$-$C_{60}$ arylene group or a substituted or unsubstituted $C_2$-$C_{60}$ heteroarylene group;

a is an integer of 1 to 5, when a is 2 or more, a plurality of $L_1$ may be identical to or different from each other;

$R_1$ and $R_2$ are, each independently, a $C_1$-$C_{60}$ alkyl group substituted with at least one —F;

b and c are, each independently, an integer of 0 to 4, and b+c≥1;

$R_3$ and $R_4$ are, each independently, selected from the group consisting of, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$R_{10}$ is selected from the group consisting of, a $C_1$-$C_{60}$ alkyl group, a $C_2$-$C_{60}$ alkenyl group, and a $C_2$-$C_{60}$ alkynyl group;

a $C_1$-$C_{60}$ alkyl group, a $C_2$-$C_{60}$ alkenyl group, and a $C_2$-$C_{60}$ alkynyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —$N(Q_{11})(Q_{12})$, wherein $Q_{11}$ and $Q_{12}$ are, each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group; and n is selected from an integer of 2 to 4.

2. The silicon-based compound of claim 1, wherein $L_1$ is selected from the group consisting of, i) phenylene, pentalenylene, indenylene, naphthylene, azulenylene, heptalenylene, indacenylene, acenaphtylene, fluorenylene, spiro-fluorenylene, phenalenylene, phenanthrenylene, anthrylene, fluoranthenylene, triphenylenylene, pyrenylene, chrysenylene, naphthacenylene, picenylene, perylenylene, pentaphenylene, hexacenylene, pyrrolylene, imidazolylene, pyrazolylene, pyridinylene, pyrazinylene, pyrimidinylene, pyridazinylene, isoindolylene, indolylene, indazolylene, purinylene, quinolinylene, benzoquinolinylene, phthalazinylene, naphthyridinylene, quinoxalinylene, quinazolinylene, cinnolinylene, carbazolylene, phenanthridinylene, acridinylene, phenanthrolinylene, phenazinylene, benzooxazolylene, benzoimidazolylene, furanylene, benzofuranylene, thiophenylene, benzothiophenylene, thiazolylene, isothiazolylene, benzothiazolylene, isoxazolylene, oxazolylene, triazolylene, tetrazolylene, oxadiazolylene, triazinylene, benzoxazolylene, dibenzofuranylene, dibenzothiophenylene, and benzocarbazolylene; and ii) phenylene, pentalenylene, indenylene, naphthylene, azulenylene, heptalenylene, indacenylene, acenaphtylene, fluorenylene, spiro-fluorenylene, phenalenylene, phenanthrenylene, anthrylene, fluoranthenylene, triphenylenylene, pyrenylene, chrysenylene, naphthacenylene, picenylene, perylenylene, pentaphenylene, hexacenylene, pyrrolylene, imidazolylene, pyrazolylene, pyridinylene, pyrazinylene, pyrimidinylene, pyridazinylene, isoindolylene, indolylene, indazolylene, purinylene, quinolinylene, benzoquinolinylene, phthalazinylene, naphthyridinylene, quinoxalinylene, quinazolinylene, cinnolinylene, carbazolylene, phenanthridinylene, acridinylene, phenanthrolinylene, phenazinylene, benzooxazolylene, benzoimidazolylene, furanylene, benzofuranylene, thiophenylene, benzothiophenylene, thiazolylene, isothiazolylene, benzothiazolylene, isoxazolylene, oxazolylene, triazolylene, tetrazolylene, oxadiazolylene, triazinylene, benzoxazolylene, dibenzofuranylene, dibenzothiophenylene, and benzocarbazolylene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, triazinyl group, quinolyl, and isoquinolyl, and a is 1 or 2.

3. The silicon-based compound of claim 1, wherein $L_1$ is selected from Formulae 2-1 to 2-8 below:

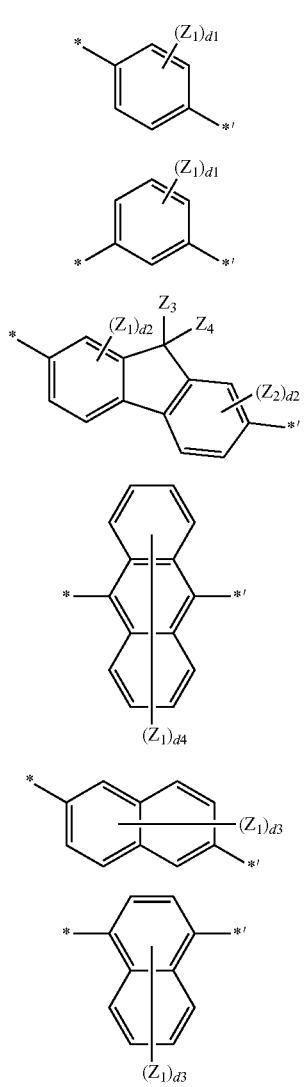

Formula 2-1

Formula 2-2

Formula 2-3

Formula 2-4

Formula 2-5

Formula 2-6

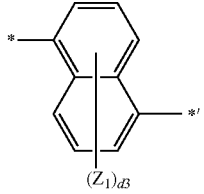

Formula 2-7

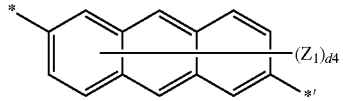

Formula 2-8

$Z_1$ to $Z_4$ are, each independently, selected from the group consisting of a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof; and phenyl group, naphthyl, and anthryl;

d1 is an integer of 1 to 4;

d2 is an integer of 1 to 3;

d3 is an integer of 1 to 6;

d4 is an integer of 1 to 8;

* is a binding site with Si of Formula 1 or is a binding site with a neighboring $L_1$; and

*' is a binding site with "N" of carbazol of Formula 1 or a binding site of a neighboring $L_1$.

4. The silicon-based compound of claim 1, wherein $R_1$ and $R_2$ are each independently a $C_1$-$C_{60}$ perfluoro alkyl group.

5. The silicon-based compound of claim 1, wherein $R_1$ and $R_2$ are each independently selected from the group consisting of methyl, ethyl, propyl, butyl, pentyl, hexyl, heptyl, and octyl, each substituted with at least one —F.

6. The silicon-based compound of claim 1, wherein $R_1$ and $R_2$ are each independently selected from the group consisting of —$CF_3$, —$C_2F_5$, —$C_3F_7$, —$C_4F_9$, —$C_5F_{11}$, and —$C_6F_{13}$.

7. The silicon-based compound of claim 1, wherein b and c are each independently, 0, 1, or 2, and b+c≥1.

8. The silicon-based compound of claim 1, wherein $R_3$ and $R_4$ are, each independently, selected from the group consisting of, a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{10}$ alkyl group, and a $C_1$-$C_{10}$ alkoxy group;

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

phenyl, naphthyl, anthryl, fluorenyl, phenanthrenyl, pyrenyl, and chrysenyl; and phenyl, naphthyl, anthryl, fluorenyl, phenanthrenyl, pyrenyl, and chrysenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

9. The silicon-based compound of claim 1, wherein $R_3$ and $R_4$ are hydrogen atoms.

10. The silicon-based compound of claim 1, wherein $R_{10}$ is selected from the group consisting of, a $C_1$-$C_{10}$ alkyl group;

a $C_1$-$C_{10}$ alkyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

phenyl, naphthyl, anthryl, fluorenyl, phenanthrenyl, pyrenyl and chrysenyl; and phenyl, naphthyl, anthryl, fluorenyl, phenanthrenyl, pyrenyl, and chrysenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

11. The silicon-based compound of claim 1, wherein n is 2.

12. The silicon-based compound of claim 1, wherein the silicon-based compound is represented by one of Formulae 1A to 1F below:

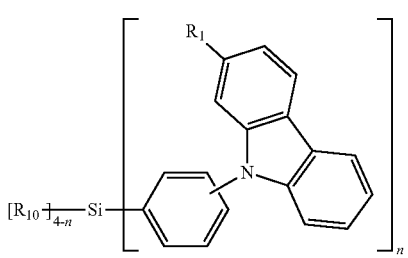

Formula 1A

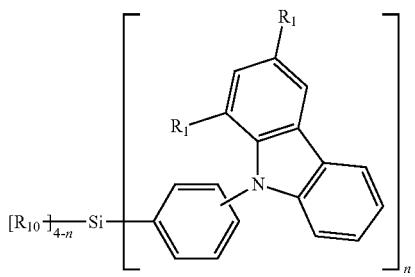

Formula 1B

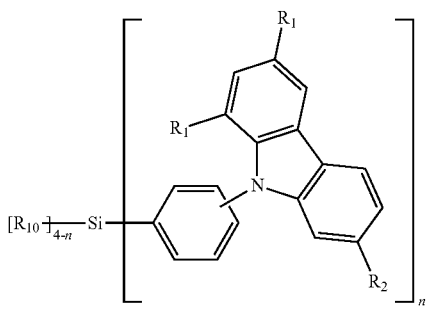

Formula 1C

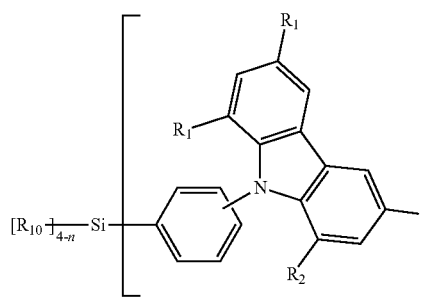

Formula 1D

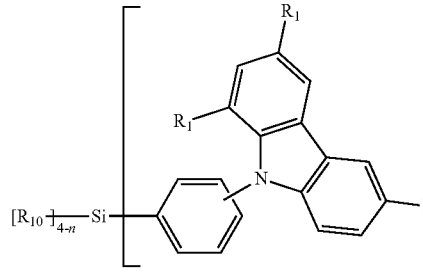

Formula 1E

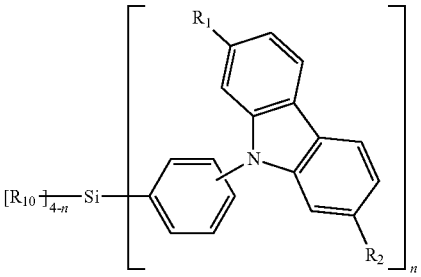

Formula 1F in Formulae 1A to 1F, $R_1$ and $R_2$ are, each independently, selected from the group consisting of methyl, ethyl, propyl, butyl, pentyl, hexyl, heptyl, and octyl, each substituted with at least one —F;

$R_{10}$ is selected from the group consisting of, a $C_1$-$C_{10}$ alkyl group;

a $C_1$-$C_{10}$ alkyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

phenyl, naphthyl, anthryl, fluorenyl, phenanthrenyl, pyrenyl and chrysenyl; and phenyl, naphthyl, anthryl, fluorenyl, phenanthrenyl, pyrenyl, and chrysenyl, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and n is an integer of 2 to 4.

13. The silicon-based compound of claim 12, wherein $R_1$ and $R_2$ are each independently selected from the group consisting of —$CF_3$, —$C_2F_5$, —$C_3F_7$, —$C_4F_9$, —$C_5F_{11}$, and —$C_6F_{13}$, and n is 2.

14. The silicon-based compound of claim 1, wherein a HOMO level absolute value of the silicon-based compound is 5.80 eV to 6.02 eV and a LUMO level absolute value of the silicon-based compound is 2.20 eV to 2.49 eV.

15. The silicon-based compound of claim 1, wherein the silicon-based compound is one of Compounds 1 to 10 below:

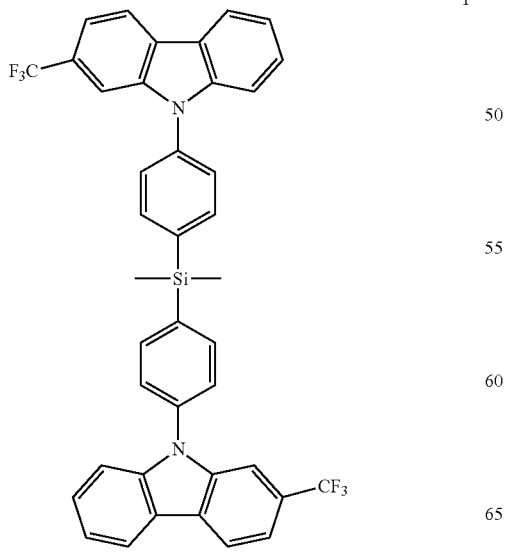

1

-continued

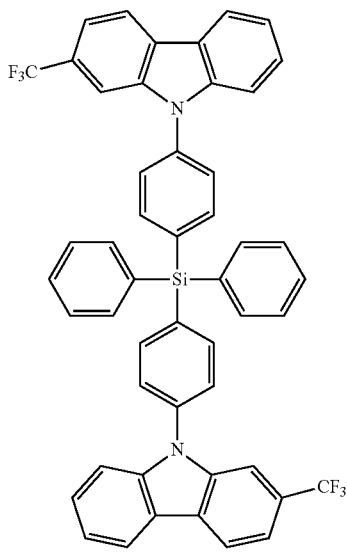

2

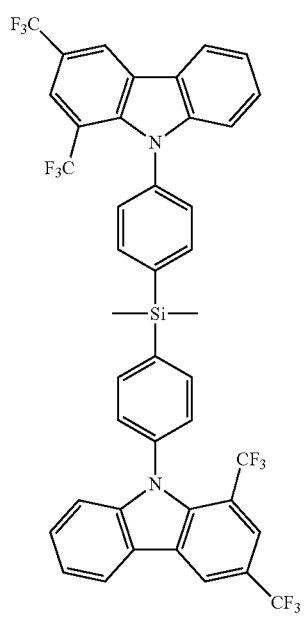

3

4
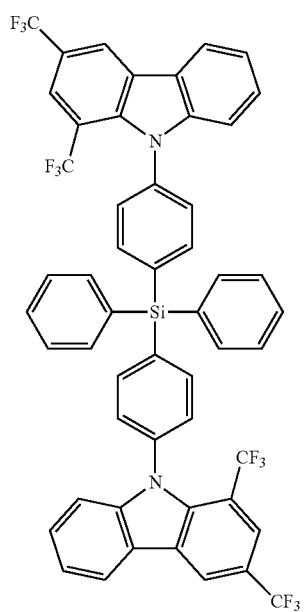
5
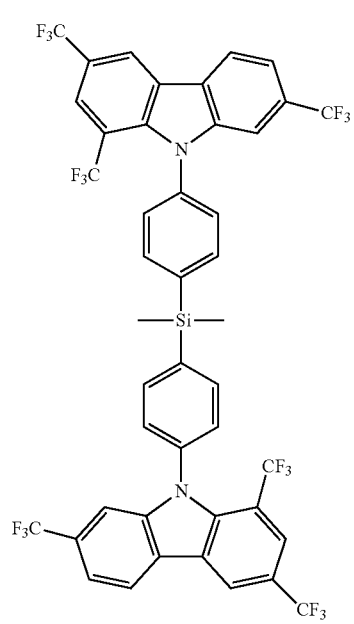
6
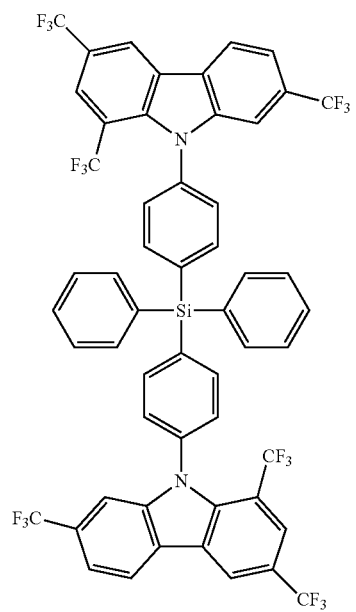
7
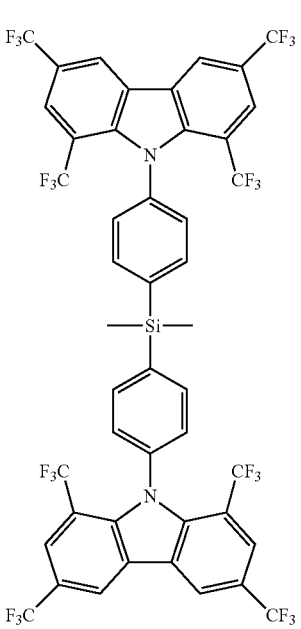

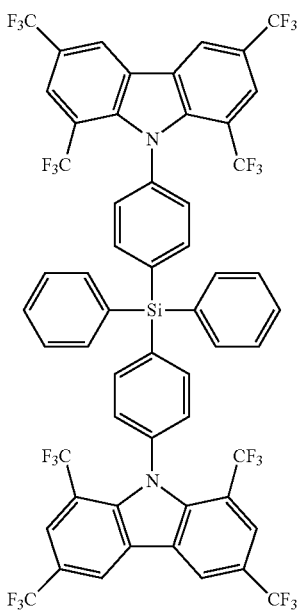

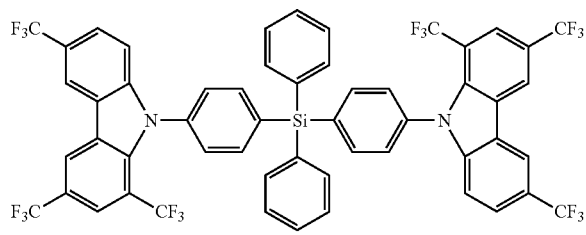

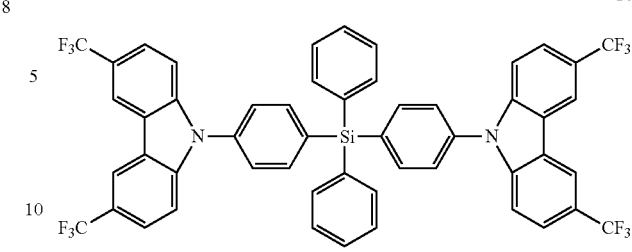

16. An organic light-emitting diode comprising: a first electrode; a second electrode facing the first electrode; and an organic layer between the first electrode and the second electrode and comprising an emission layer, wherein the organic layer comprises at least one of the silicon-based compound of claim 1.

17. The organic light-emitting diode of claim 16, wherein the organic layer further comprises
   i) at least one layer selected from the group consisting of a hole injection layer, a hole transport layer, a functional layer having a hole injection function and a hole transport function, a buffer layer, and an electron blocking layer between the first electrode and the emission layer, and
   ii) at least one layer selected from the group consisting of a hole blocking layer, an electron transport layer, and an electron injection layer interposed between the emission layer and the second electrode.

18. The organic light-emitting diode of claim 17, wherein the emission layer comprises the silicon-based compound.

19. The organic light-emitting diode of claim 18, wherein the emission layer further comprises a blue phosphorescent dopant for emitting blue light based on a phosphorescent light emission mechanism, and wherein the silicon-based compound in the emission layer acts as a host.

20. The organic light-emitting diode of claim 17, wherein the at least one layer selected from the group consisting of the hole injection layer, the hole transport layer, and the functional layer having a hole injection function and a hole transport function comprises a charge-generation material.

* * * * *